US012660227B2

(12) United States Patent
Tsai et al.

(10) Patent No.: US 12,660,227 B2
(45) Date of Patent: Jun. 16, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Tsung-Han Tsai, Kaohsiung City (TW); Pin Chun Shen, Changhua County (TW); Ta-Chun Lin, Hsinchu (TW); Chun-Sheng Liang, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 494 days.

(21) Appl. No.: 18/186,211

(22) Filed: Mar. 20, 2023

(65) Prior Publication Data

US 2024/0322024 A1     Sep. 26, 2024

(51) Int. Cl.
| | |
|---|---|
| *H10D 30/43* | (2025.01) |
| *H10D 30/01* | (2025.01) |
| *H10D 30/67* | (2025.01) |
| *H10D 62/10* | (2025.01) |
| *H10D 64/01* | (2025.01) |

(52) U.S. Cl.
CPC ........... *H10D 30/43* (2025.01); *H10D 30/014* (2025.01); *H10D 30/6729* (2025.01); *H10D 30/6735* (2025.01); *H10D 62/121* (2025.01); *H10D 64/01* (2025.01); *H10D 64/017* (2025.01); *H10D 64/018* (2025.01)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |

(Continued)

*Primary Examiner* — Yara B Green
*Assistant Examiner* — Coralie A Nettles
(74) *Attorney, Agent, or Firm* — JCIPRNET

(57) ABSTRACT

A semiconductor device and a manufacturing method thereof are provided. The semiconductor device includes first semiconductor channel layers, second semiconductor channel layers, a dielectric wall, a gate structure, a source/drain electrode and an inner spacer. The first semiconductor channel layers are stacked vertically apart along a first direction over a substrate. The second semiconductor channel layers are stacked vertically apart along the first direction over the substrate. The dielectric wall is disposed between and separates the first semiconductor channel layers and the second first semiconductor channel layers, wherein the dielectric wall comprises a liner and a dielectric wall material disposed over the liner. The gate structure extends along a second direction perpendicular to the first direction disposed crossing over a channel region of the first fin structure and a channel region of the second fin structure. The source/drain electrode is in contact with the first semiconductor channel layers. The inner spacer is enclosed by the first semiconductor channel layers, the gate structure, the dielectric wall and the source/drain electrode, wherein the inner spacer is in contact with the dielectric wall material of the dielectric wall.

20 Claims, 39 Drawing Sheets

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2020/0266192 A1* | 8/2020 | Ju ..................... | H10D 84/834 |
| 2023/0095140 A1* | 3/2023 | Xie ................... | H10D 30/6735 |
| | | | 257/288 |

* cited by examiner

SEMICONDUCTOR DEVICE AND MANUFACTURING METHOD THEREOF

BACKGROUND

Semiconductor industry has experienced rapid growth due to continuous improvement in integration density of various electronic devices (e.g., transistors, diodes, capacitors or the like). Particularly, increasing the integration density may result in benefits in terms of device speed and manufacturing cost. For the most part, improvement in the integration density has come from repeated reductions in feature size of the electronic devices. Let alone difficulties in manufacturing the electronic devices with finer feature size, the feature size are getting closer to physical limit. A more innovated approach for further increasing the integration density is required.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A-14A are schematic cross-sectional views of various stages in a manufacturing method of a semiconductor device in accordance with some embodiments of the disclosure.

FIGS. 11B-14B are schematic cross-sectional views of various stages in a manufacturing method of a semiconductor device in accordance with some embodiments of the disclosure.

FIGS. 11C-14C are schematic cross-sectional views of various stages in a manufacturing method of a semiconductor device in accordance with some embodiments of the disclosure.

FIGS. 11D-14D are schematic cross-sectional views of various stages in a manufacturing method of a semiconductor device in accordance with some embodiments of the disclosure.

DETAILED DESCRIPTION

Figure 1A:
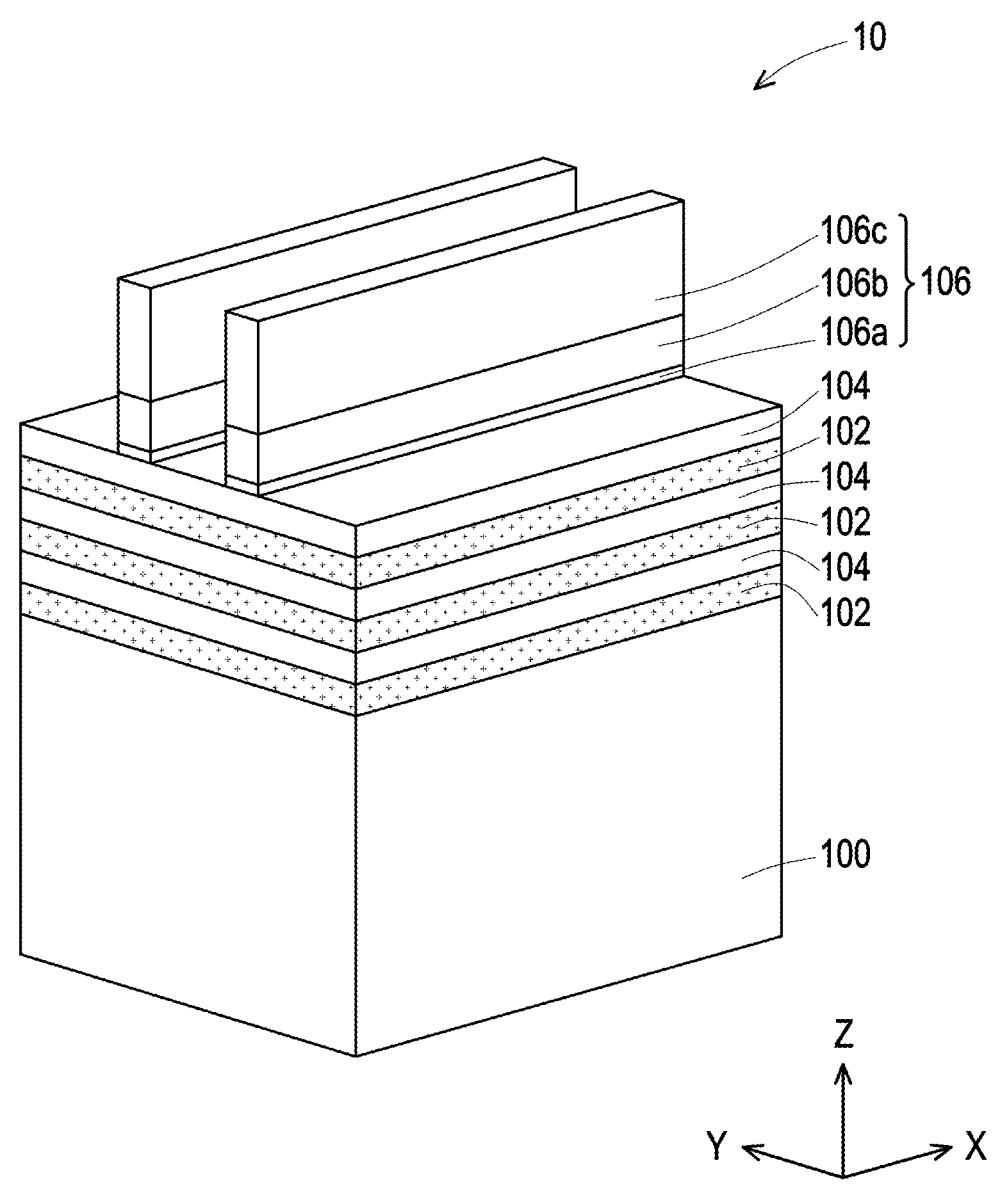
FIG. 1A through FIG. 1M are schematic perspective views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

It should be appreciated that the following embodiment(s) of the present disclosure provides applicable concepts that can be embodied in a wide variety of specific contexts. The embodiments are intended to provide further explanations but are not used to limit the scope of the present disclosure. The specific embodiment(s) described herein is related to a structure containing one or more semiconductor devices, and is not intended to limit the scope of the present disclosure. Embodiments of the present disclosure describe the exemplary manufacturing process of the semiconductor device(s) formed with one or more transistors. Certain embodiments of the present disclosure are related to the semiconductor device including semiconductor transistors and/or other elements. The substrates and/or wafers may include one or more types of integrated circuits or electronic components therein. The semiconductor device(s) may be formed on a bulk semiconductor substrate or a silicon/germanium-on-insulator substrate. In addition, source/drain region(s) may refer to a source or a drain, individually or collectively dependent upon the context.

Figure 2:
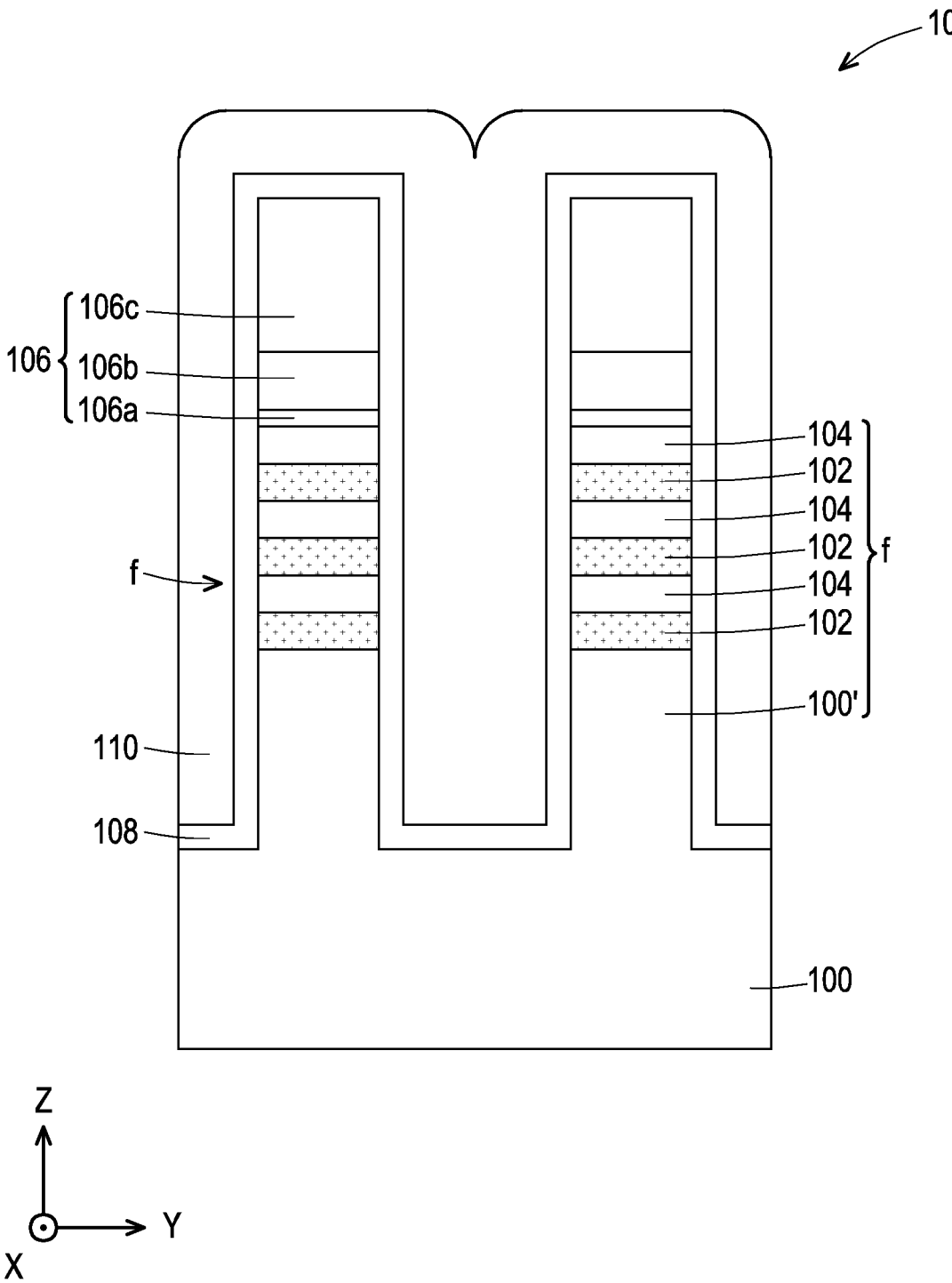
FIG. 2 is a schematic cross-sectional view along line A-A' shown in FIG. 1C.
Figure 3:
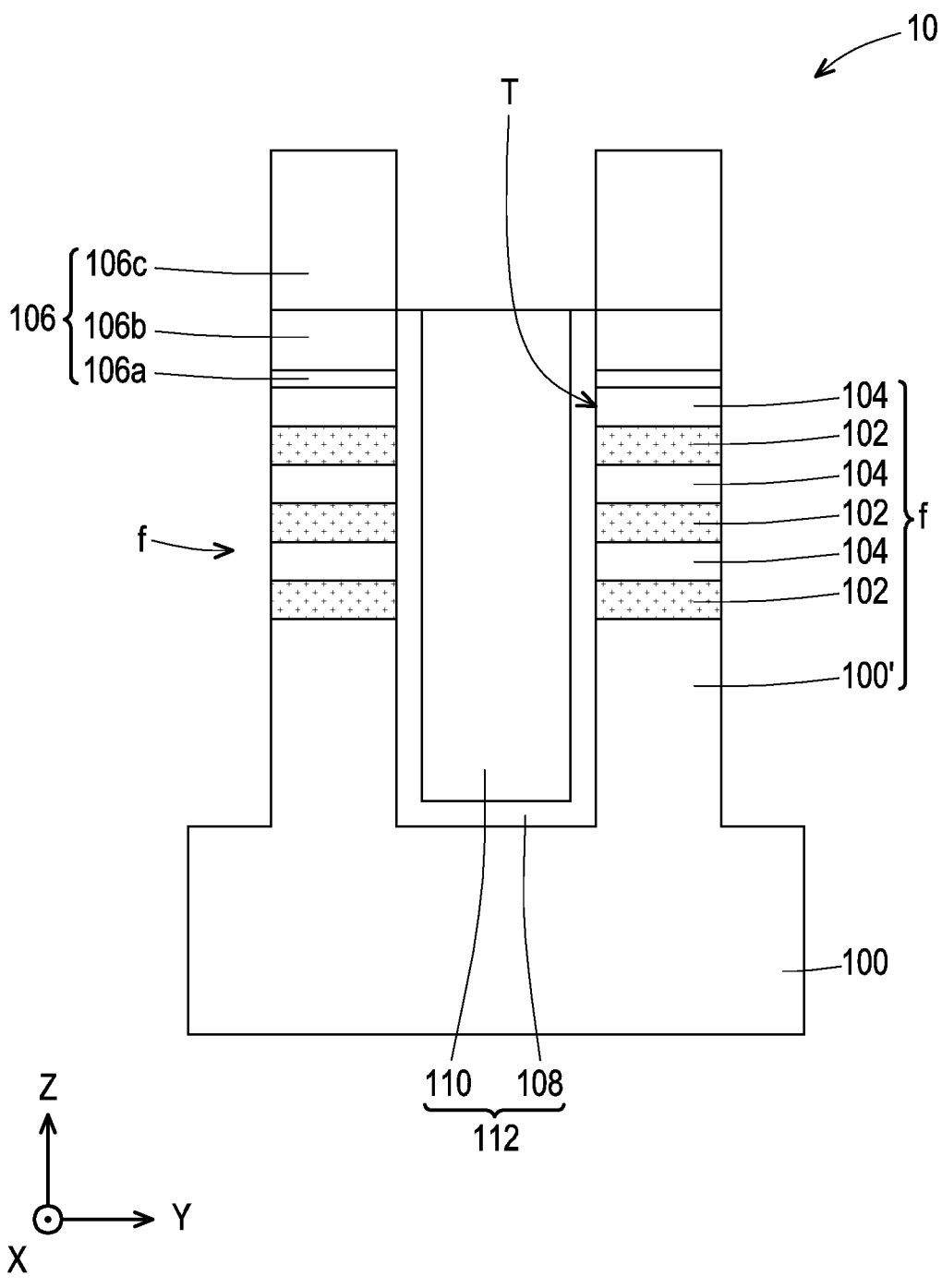
FIG. 3 is a schematic cross-sectional view along line A-A' shown in FIG. 1D.
Figure 4:
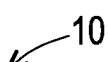
FIG. 4 is a schematic cross-sectional view along line A-A' shown in FIG. 1E.
Figure 4:
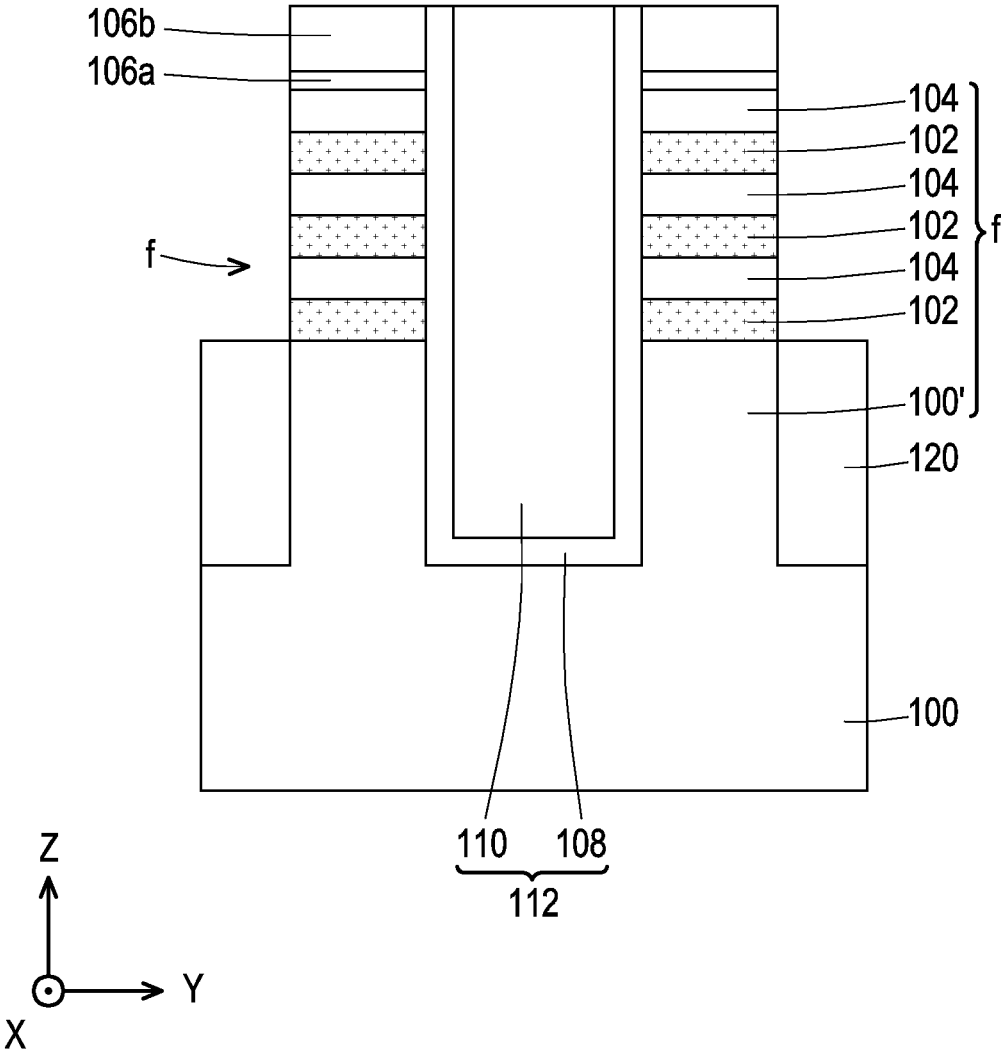
Figure 5:
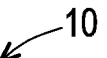
FIG. 5 is a schematic cross-sectional view along line A-A' shown in FIG. 1F.
Figure 5:
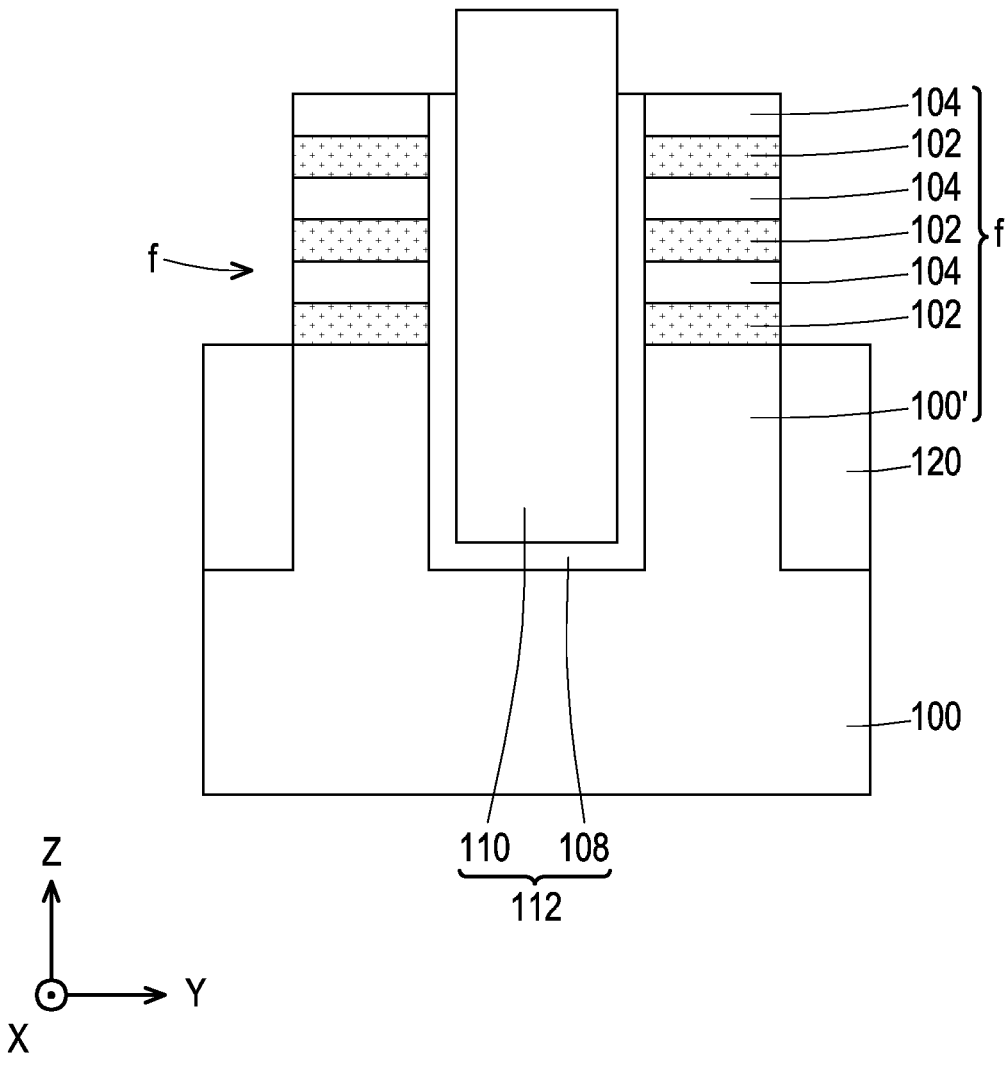
Figure 6A:
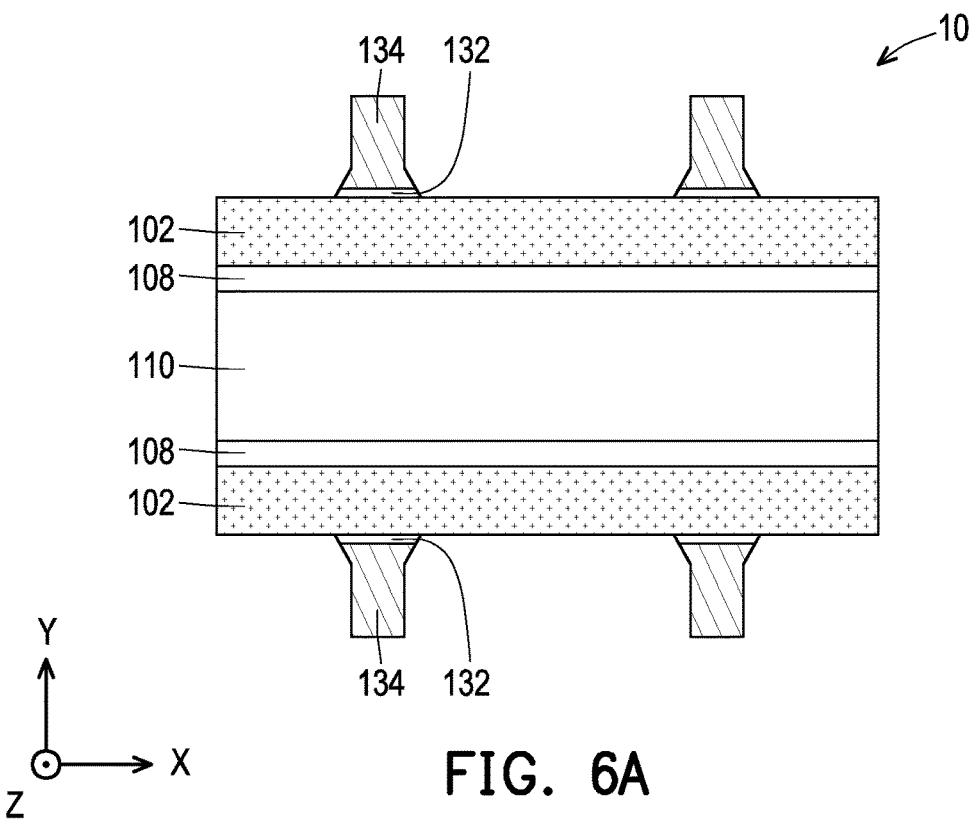
FIG. 6A and FIG. 6B respectively are schematic cross-sectional views along line I-I' and line II-II' shown in FIG. 1G.
Figure 6B:
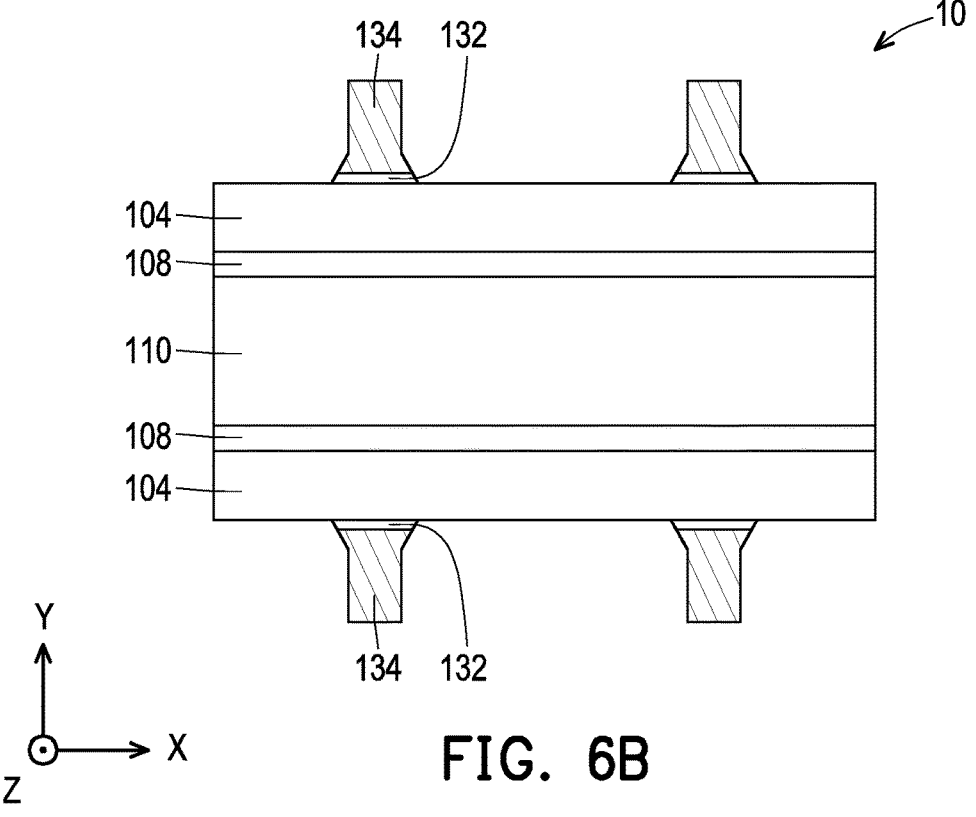
Figure 7A:
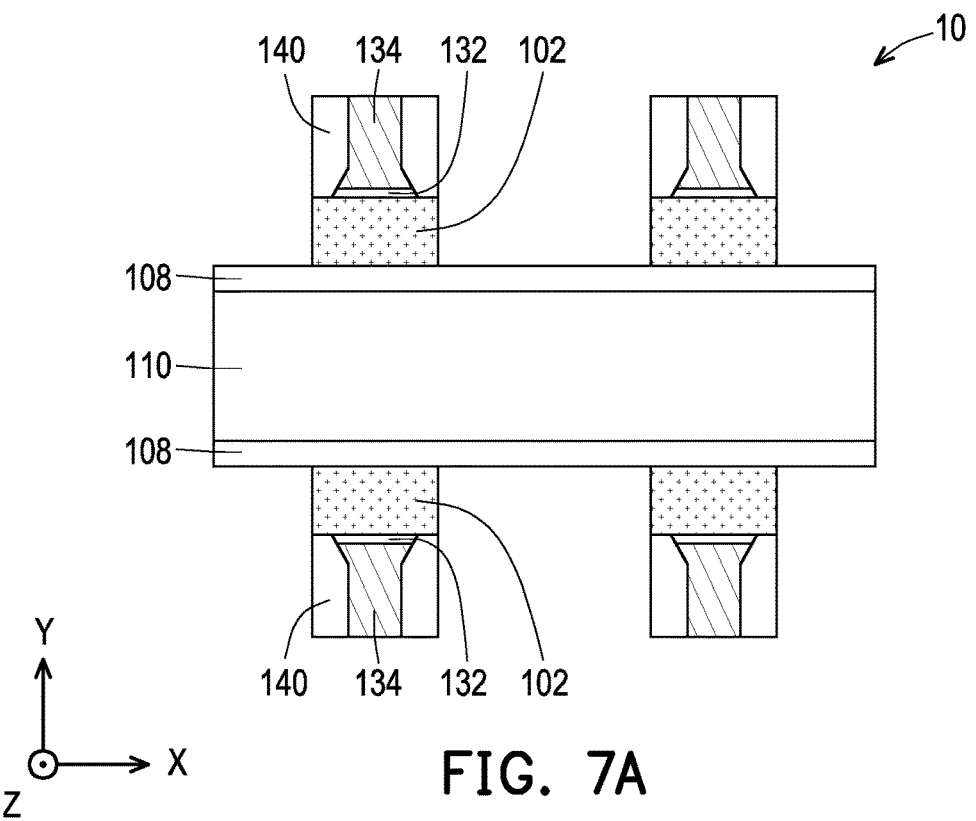
FIG. 7A and FIG. 7B respectively are schematic cross-sectional views along line I-I' and line II-II' shown in FIG. 1I.
Figure 7B:
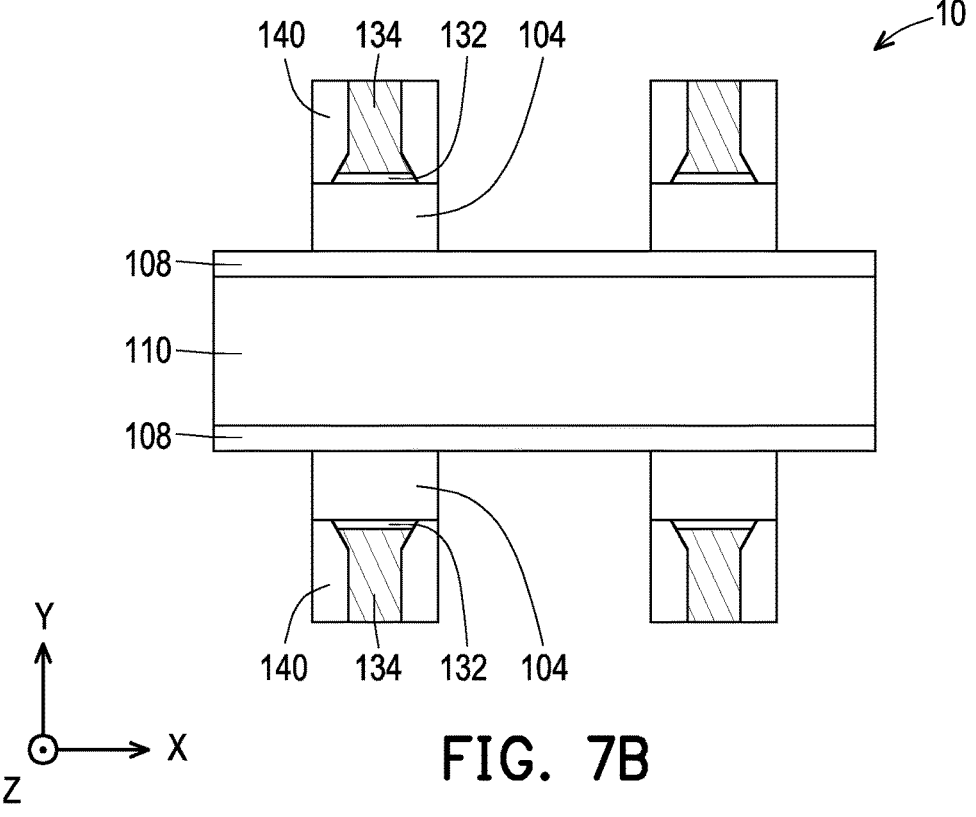
Figure 8A:
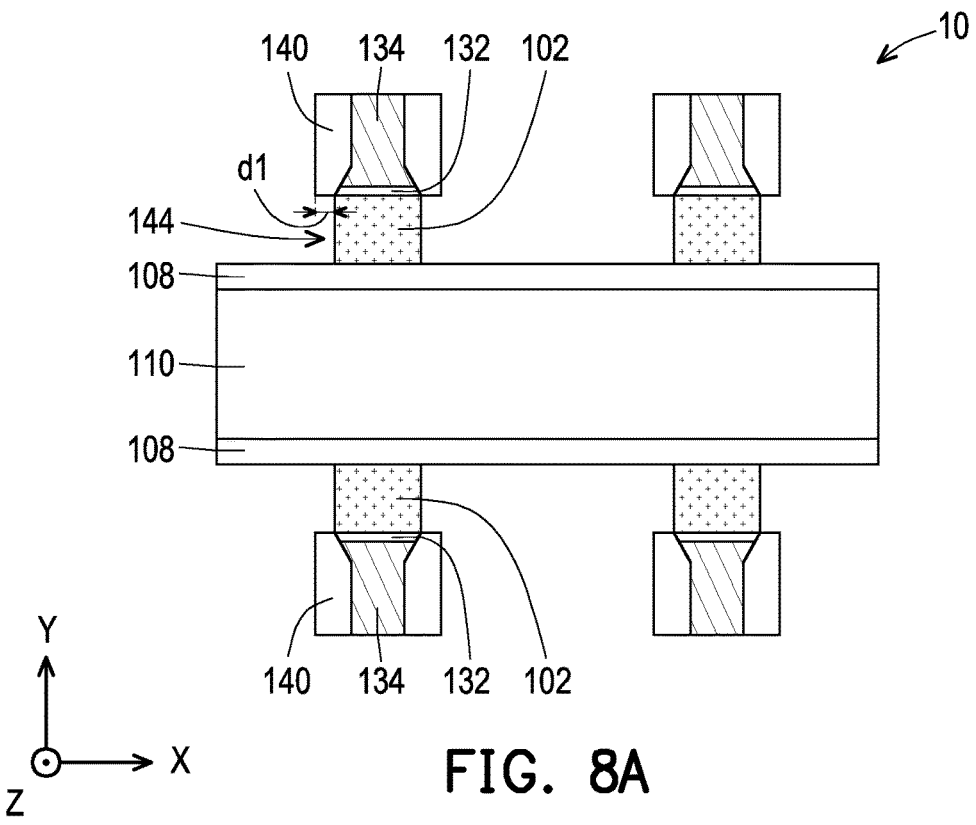
FIG. 8A and FIG. 8B respectively are schematic cross-sectional views along line I-I' and line II-II' shown in FIG. 1J.
Figure 8B:
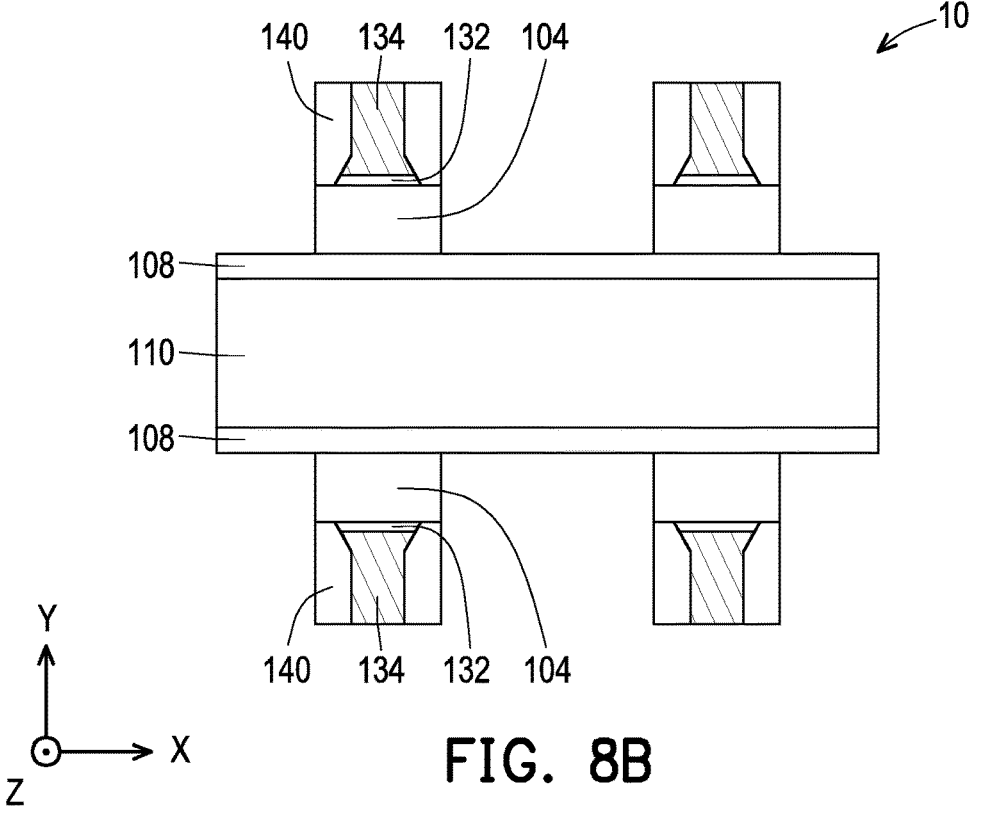
Figure 9A:
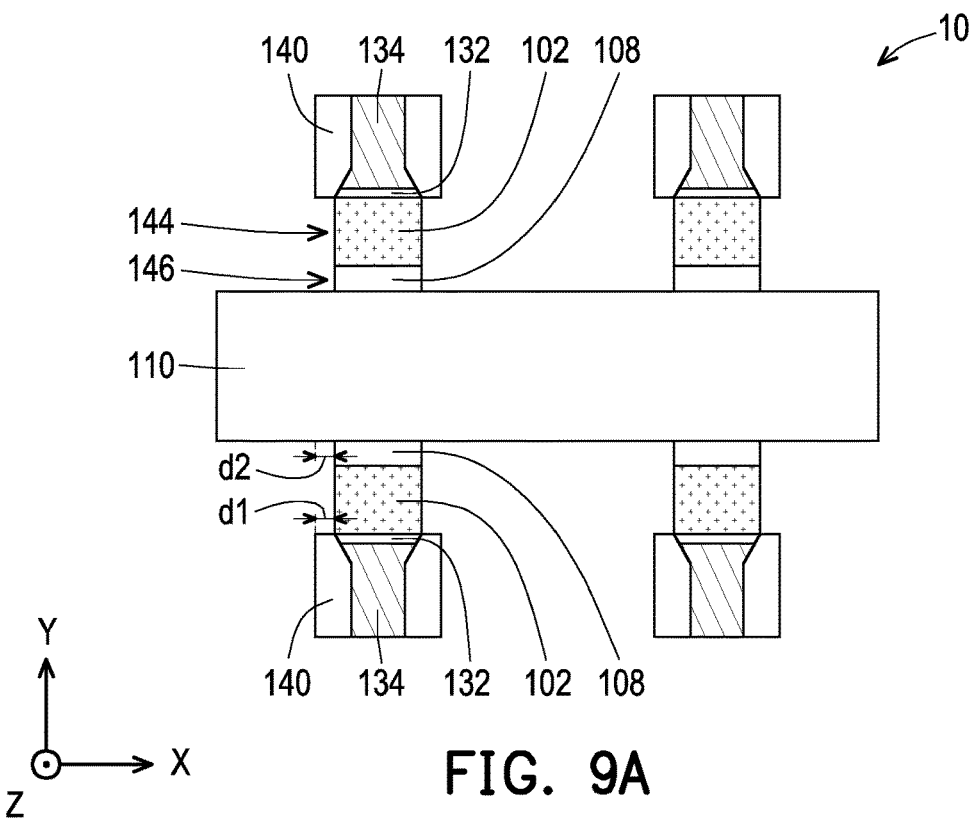
FIG. 9A, FIG. 9B and FIG. 9C respectively are schematic cross-sectional views along line I-I', line II-II' and line A-A' shown in FIG. 1K.
Figure 9B:
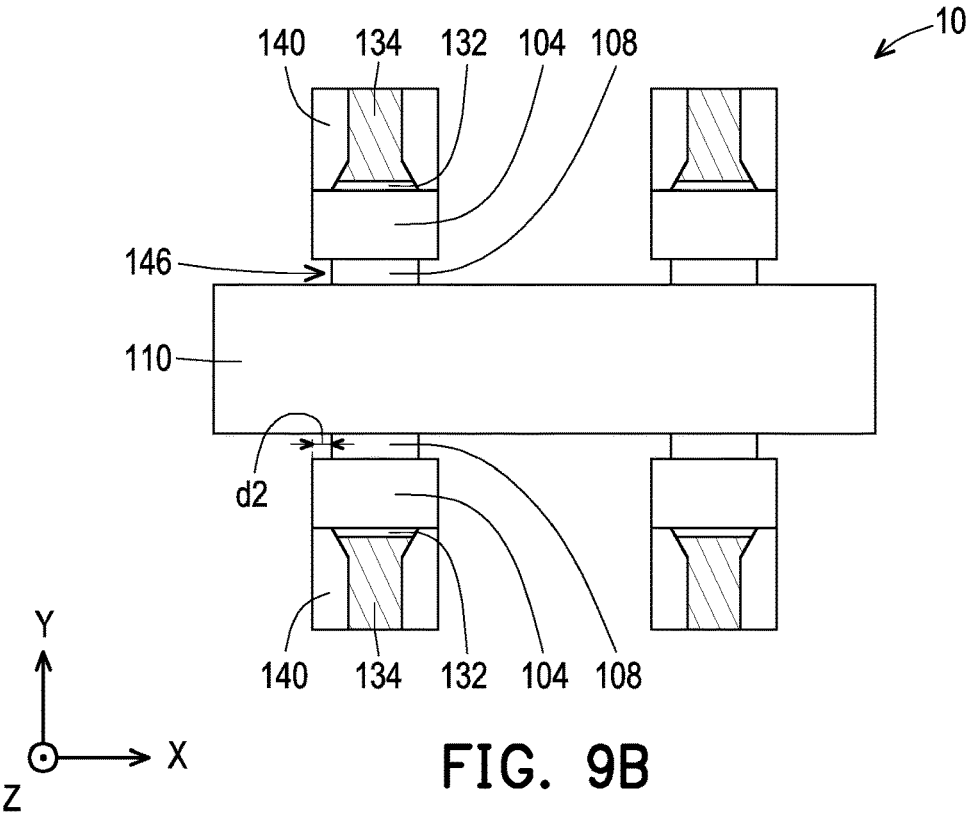
Figure 9C:
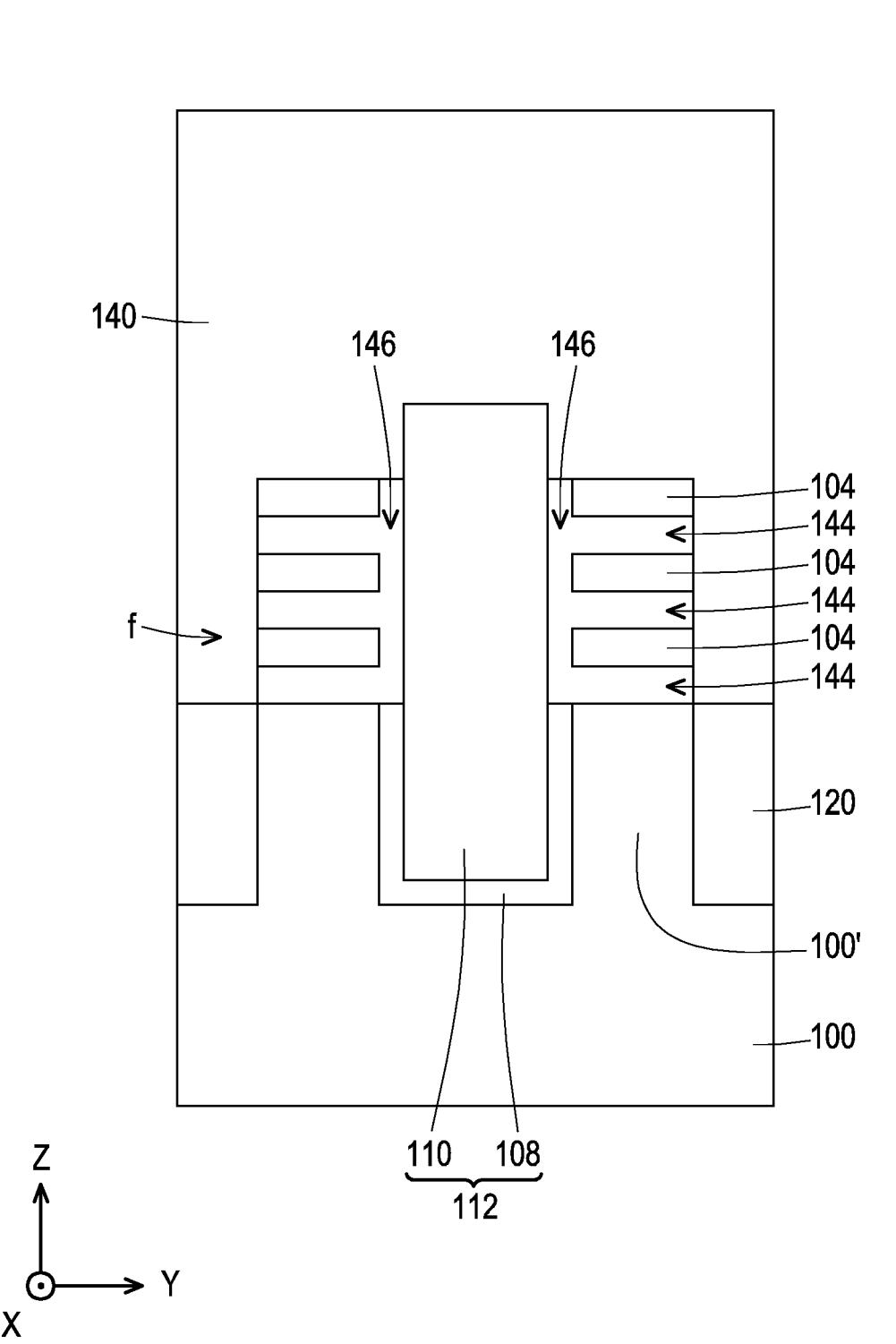
Figure 10A:
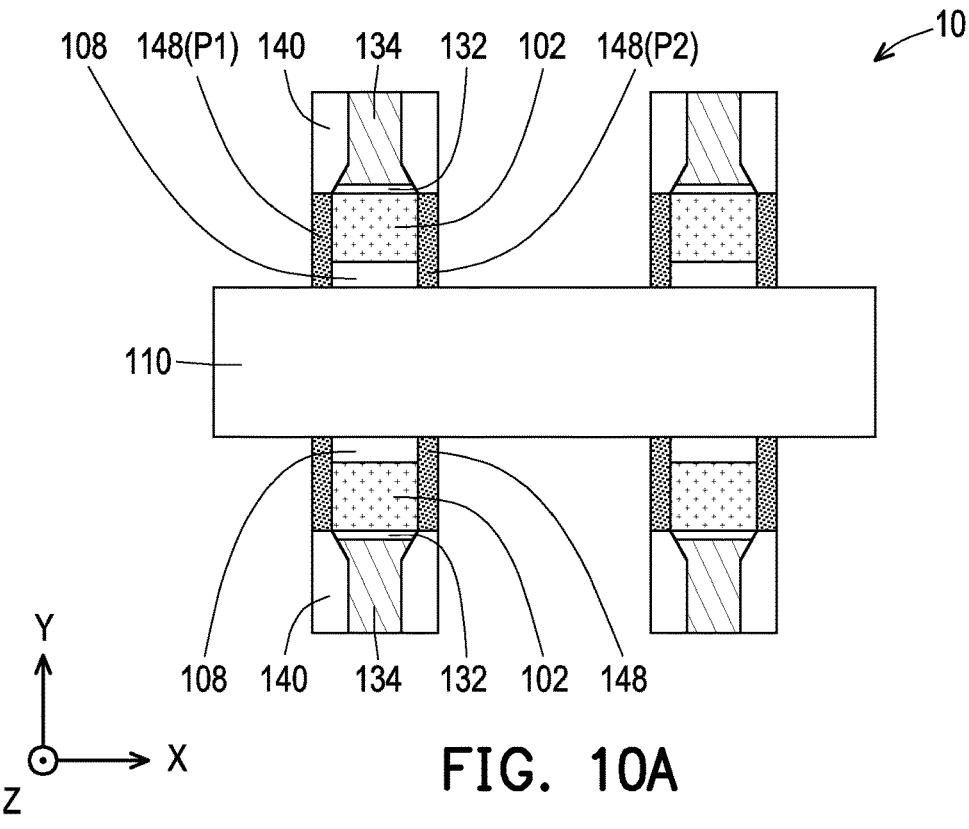
FIG. 10A, FIG. 10B and FIG. 10C respectively are schematic cross-sectional views along line I-I', line II-II' and line A-A' shown in FIG. 1L.
Figure 10B:
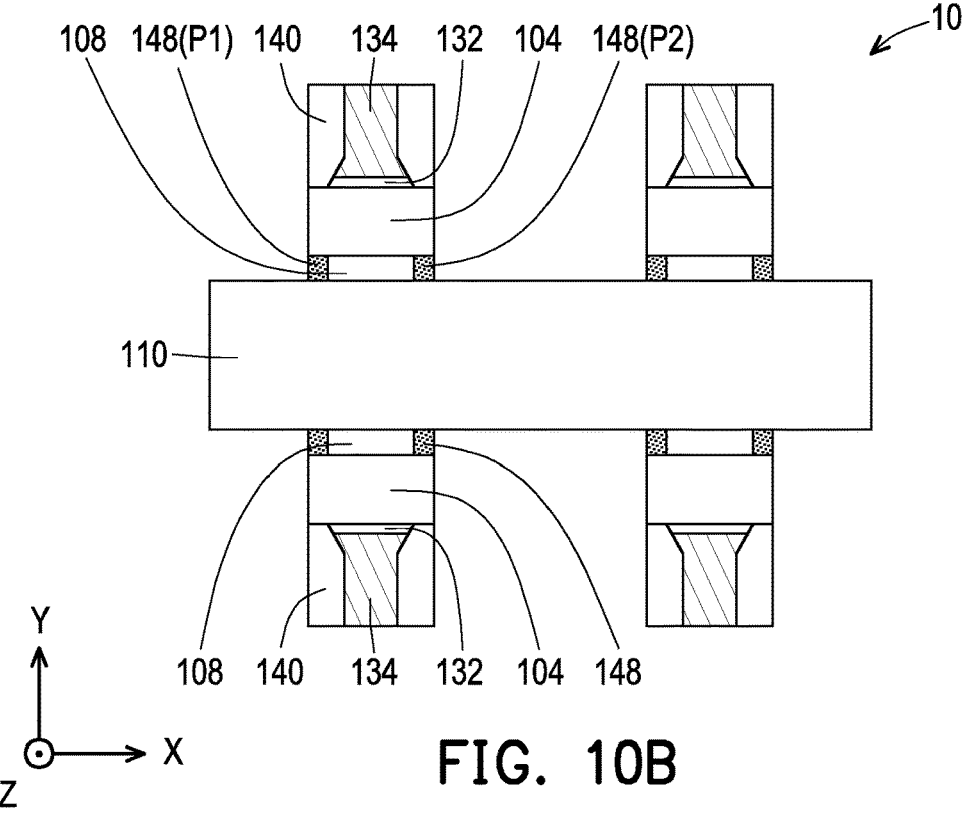
Figure 10C:
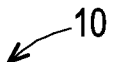
Figure 10C:
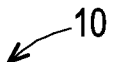
Figure 11A:
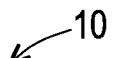
Figure 11B:
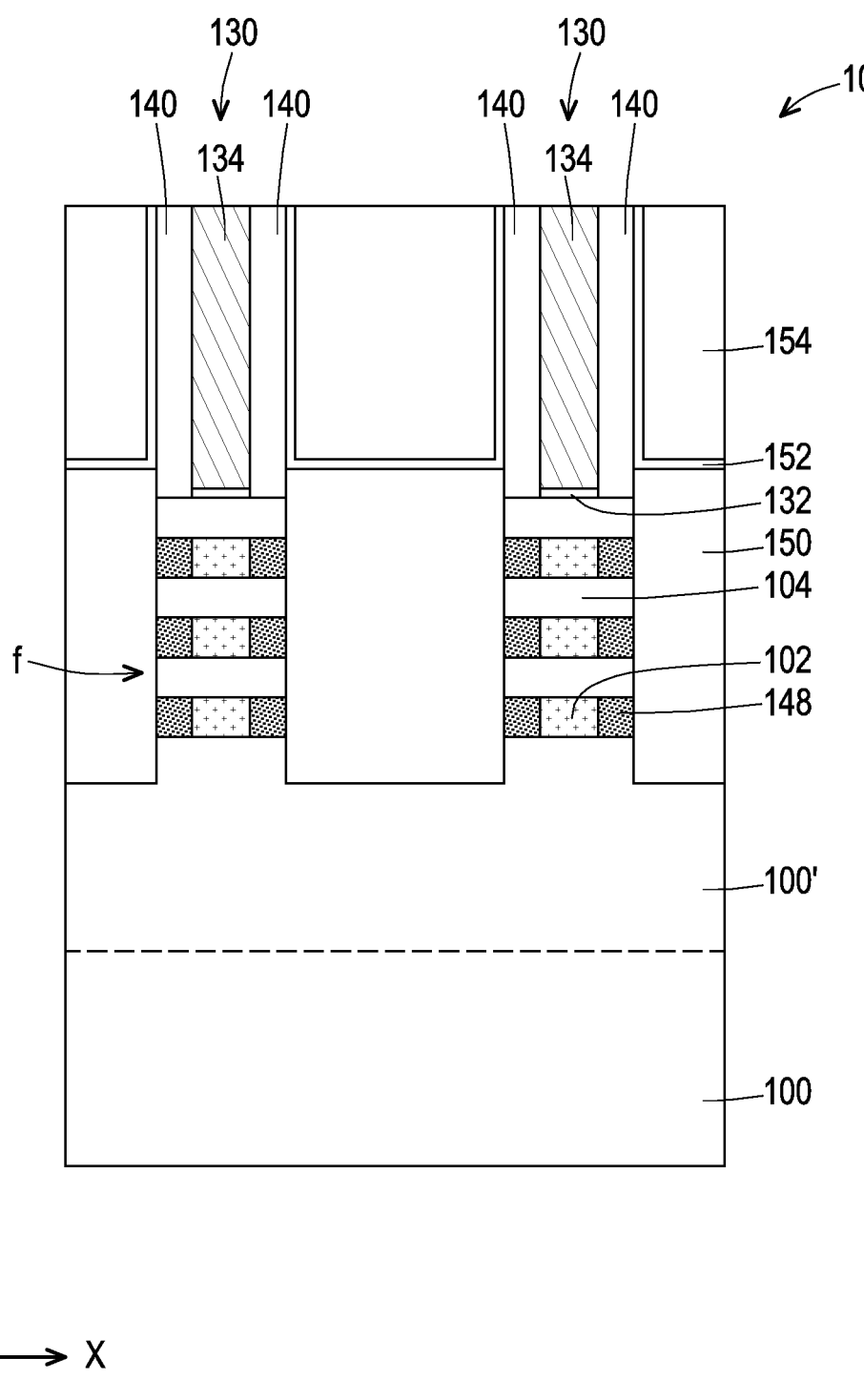
Figure 11C:
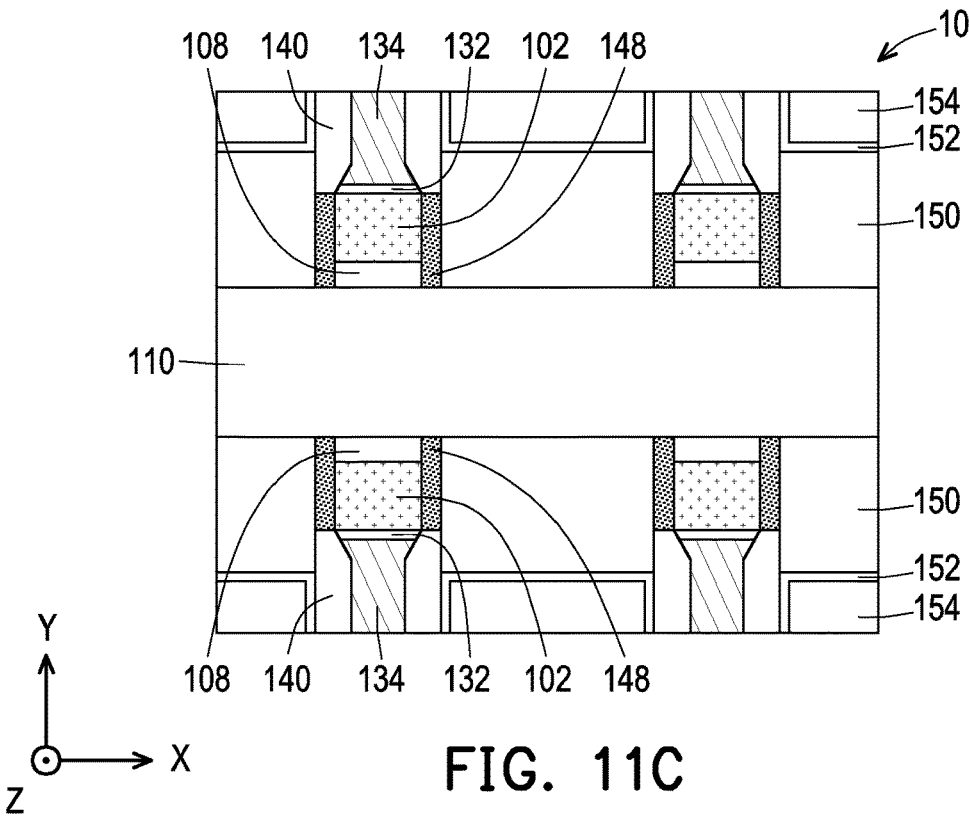
Figure 11D:
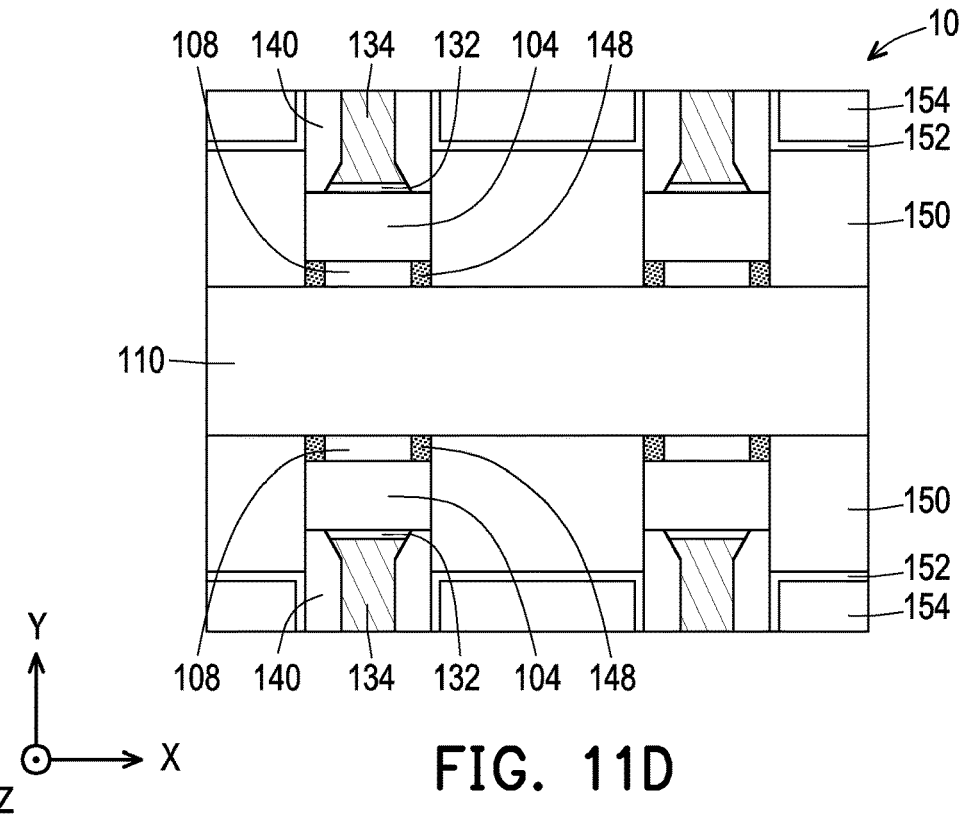

FIG. 1A through FIG. 1M are schematic perspective views of various stages in a manufacturing method of a semiconductor device in accordance with some embodiments of the disclosure. FIG. 2 is a schematic cross-sectional view along line A-A' shown in FIG. 1C. FIG. 3 is a schematic cross-sectional view along line A-A' shown in FIG. 1D. FIG. 4 is a schematic cross-sectional view along line A-A' shown in FIG. 1E. FIG. 5 is a schematic cross-sectional view along line A-A' shown in FIG. 1F. FIG. 6A and FIG. 6B respectively are schematic cross-sectional views along line I-I' and line II-II' shown in FIG. 1G. FIG. 7A and FIG. 7B respectively are schematic cross-sectional views along line I-I' and line II-II' shown in FIG. 1I. FIG. 8A and FIG. 8B respectively are schematic cross-sectional views along line I-I' and line II-II' shown in FIG. 1J. FIG. 9A, FIG. 9B and FIG. 9C respectively are schematic cross-sectional views along line I-I', line II-II' and line A-A' shown in FIG. 1K. FIG. 10A, FIG. 10B and FIG. 10C respectively are schematic cross-sectional views along line I-I', line II-II' and line A-A' shown in FIG. 1L. FIGS. 11A-14A are schematic cross-sectional views of various stages in a manufacturing method of a semiconductor device in accordance with some embodiments of the disclosure. FIGS. 11B-14B are schematic cross-sectional views of various stages in a manufacturing method of a semiconductor device in accordance with some embodiments of the disclosure. FIGS. 11C-14C are schematic cross-sectional views of various stages in a manufacturing method of a semiconductor device in accordance with some embodiments of the disclosure. FIGS. 11D-14D are schematic cross-sectional views of various stages in a manufacturing method of a semiconductor device in accordance with some embodiments of the disclosure. FIG. 11A is the cross-sectional view taken along line C-C' shown in FIG. 1M. FIG. 11B is the cross-sectional view taken along line B-B' shown in FIG. 1M. FIG. 11C is the cross-sectional view taken along line I-I' shown in FIG. 1M. FIG. 11D is the cross-sectional view taken along line II-II' shown in FIG. 1M. It is understood that additional operations can be provided before, during, and after the operations shown by FIGS. 1A-1M, FIGS. 11A-14A, FIGS. 11B-14B, FIGS. 11C-14C and FIGS. 11D-14D, and some of the operations described below can be replaced or eliminated, for additional embodiments of the method. The order of the operations/processes may be interchangeable.

The semiconductor device 10 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type field-effect transistors (PFETs), n-type FETs (NFETs), fin-like FETs (FinFETs), metal-oxide semiconductor field effect transistors (MOS-FET), complementary metal-oxide semiconductor (CMOS) transistors, bipolar transistors, high voltage transistors, high frequency transistors, and/or other memory cells. The semiconductor device 10 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an IC. In some embodiments, the semiconductor device 10 may be a portion of an IC chip, a system on chip (SoC), or portion thereof. The present disclosure is not limited to any particular number of devices or device regions, or to any particular device configurations.

Referring to FIG. 1A, a substrate (wafer) 100 is provided. In the depicted embodiment, the substrate 100 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadnium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. In some embodiments, the substrate 100 is doped with a p-type or n-type dopant of a dopant concentration about $1 \times 10^{15}$ atoms/cm$^{-3}$ to about $1 \times 10^{19}$ atoms/cm$^{-3}$.

The substrate 100 may include various doped regions. In some embodiments, the substrate 100 includes n-type doped regions (for example, n-type wells) doped with n-type dopants, such as phosphorus (for example, 31P), arsenic, other n-type dopant, or combinations thereof. In some embodiments, the substrate 100 includes p-type doped region (for example, p-type wells) doped with p-type dopants, such as boron (for example, $^{11}$B, BF$_2$), indium, other p-type dopant, or combinations thereof. In some embodiments, the substrate 100 includes doped regions formed with a combination of p-type dopants and n-type dopants. The various doped regions can be formed directly on and/or in the substrate 100, for example, providing a p-well structure, an n-well structure, a dual-well structure, a raised structure, or combinations thereof. An ion implantation process, a diffusion process, and/or other suitable doping process can be performed to form the various doped regions.

The substrate 100 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 100 comprises silicon germanium (SiGe) buffer layers epitaxially grown on the silicon substrate 100. The Ge concentration of the SiGe buffer layers may increase from 30 atomic % germanium for the bottommost buffer layer to 70 atomic % germanium for the topmost buffer layer.

Still referring to FIG. 1A, stacked semiconductor layers are formed over the substrate 100. The stacked semiconductor layers include first semiconductor layers 102 and second semiconductor layers 104. As shown in FIG. 1, the first semiconductor layers 102 and the second semiconductor layers 104 are alternately formed on the substrate 100, so as to form a stacking structure on the substrate 100. In some embodiments, the first semiconductor layers 102 and the second semiconductor layers 104 are made of different semiconductor materials, such that the first semiconductor layers 102 could have a sufficient etching selectivity with respect to the second semiconductor layers 104. From another point of view, the first semiconductor layers 102 and the second semiconductor layers 104 are made of materials having different lattice constants. In some embodiments, the material of each of the first semiconductor layers 102 and the second semiconductor layers 104 includes Si, Ge, SiGe, SiC, GeSn, SiGeSn, GaN, InGaN, GaAs, InSb, GaP, GaSb, InAlAs, InGaAs, GaSbP, GaAsSb or InP. In some embodiments, the first semiconductor layers 102 are made of SiGe, whereas the second semiconductor layers 104 are made of Si. In certain embodiments, the first semiconductor layers 102 are made of $Si_{1-x}Ge_x$, where $0.15 \leq x \leq 0.5$, and second semiconductor layers 104 are made of Si. In some embodiments, $0.15 \leq x \leq 0.25$. In other embodiments, the second semiconductor layers 104 are made of $Si_{1-y}Ge_y$, where y is equal to or less than about 0.2 and x>y.

In FIG. 1A, three layers of the first semiconductor layer 102 and three layers of the second semiconductor layer 104 are disposed. However, the number of the layers are not limited to three, and may be as small as 1 (each layer) and in some embodiments, 2-20 layers of each of the first and second semiconductor layers are formed. By adjusting the numbers of the stacked layers, a driving current of the semiconductor device 10 can be adjusted.

In some embodiments, the first semiconductor layers 102 and the second semiconductor layers 104 are epitaxially formed over the substrate 100. The thickness of the first semiconductor layers 102 may be equal to or smaller than that of the second semiconductor layers 104, and is in a range from about 2 nm to about 10 nm in some embodiments, and is in a range from about 3 nm to about 5 nm in other embodiments. The thickness of the second semiconductor layers 104 is in a range from about 5 nm to about 20 nm in some embodiments, and is in a range from about 7.5 nm to about 12.5 nm in other embodiments. The thickness of each of the first and second semiconductor layers may be the same, or may vary. In some embodiments, the bottom first semiconductor layer (the closest layer to the substrate 100) is thicker than the remaining first semiconductor layers. The thickness of the bottom first semiconductor layer is in a range from about 10 nm to about 50 nm in some embodiments, or is in a range from 20 nm to 40 nm in other embodiments.

Further, still referring to FIG. 1A, mask structures 106 formed over the stacking structure. In some embodiments, the mask structures 106 are hard mask structure. In some embodiments, the mask structures 106 are arranged along a second direction Y, and are extending along a first direction X intersected with the second direction Y (e.g., perpendicular to the second direction Y). In addition, in some embodiments, each mask structure 106 includes a pad oxide layer 106a, a pad nitride layer 106b formed over the pad oxide layer 106a, a hard mask layer 106c formed over the pad nitride layer 106b. A method for forming the mask structures 106 may include one or more deposition process (e.g., chemical vapor deposition (CVD) process (including low pressure CVD (LPCVD) process and plasma enhanced CVD (PECVD) process), physical vapor deposition (PVD) process, atomic layer deposition (ALD) process), a thermal oxidation, and a self-aligned multiple patterning process (e.g., a self-aligned double patterning (SADP) process or a self-aligned quadruple patterning (SAQP) process). In some embodiments, the pad oxide layer 106a is made of a silicon oxide, which can be formed by a thermal oxidation; and the pad nitride layer 106b is made of a silicon nitride, silicon oxynitride and/or silicon carbide, which is formed by CVD process, including LPCVD process and PECVD process, PVD process, ALD process, or other suitable process. The mask structures 106 are patterned into a mask pattern by using patterning operations including photo-lithography and etching process. In some embodiments, the photo-lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof.

Figure 1B:
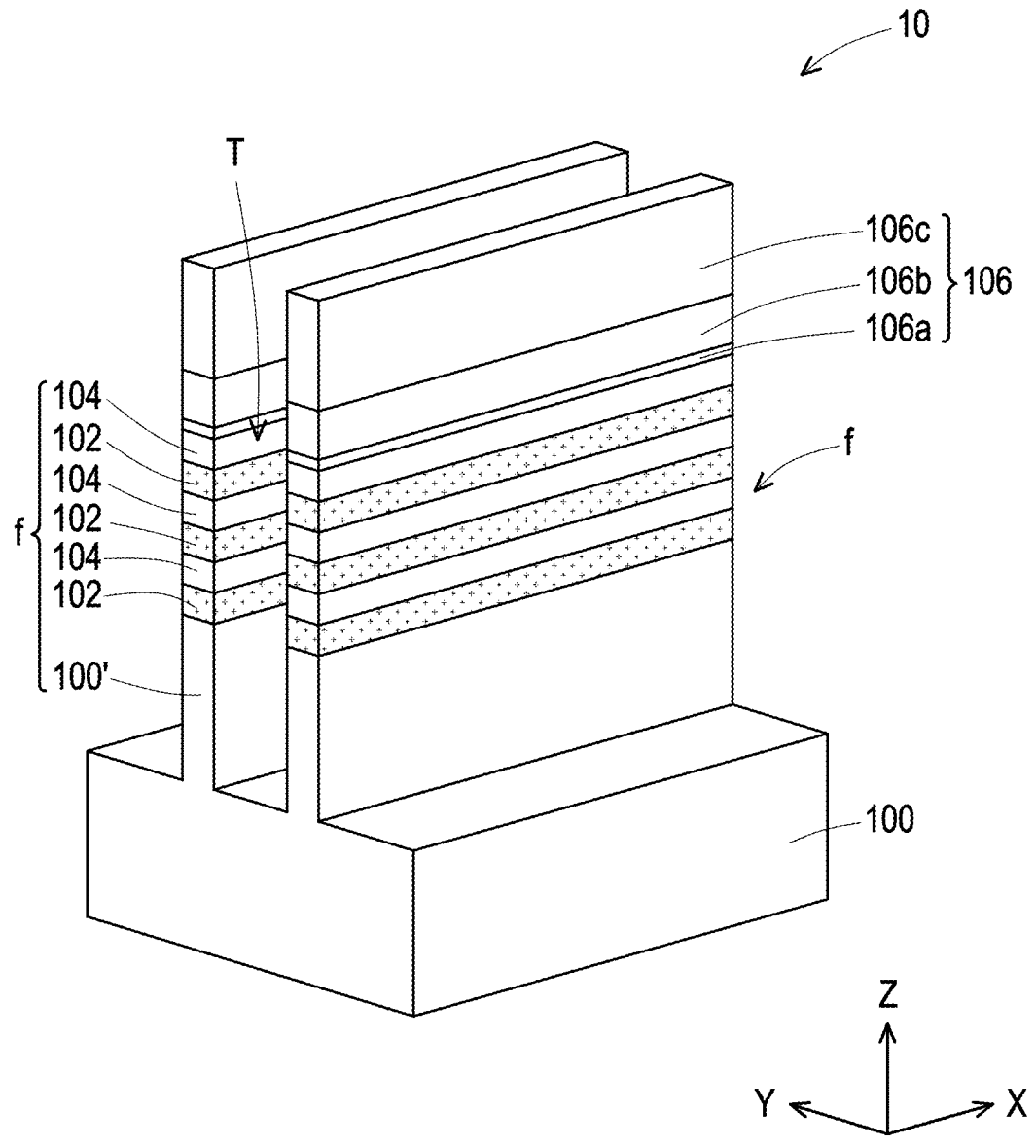

Referring to FIG. 1B, a top portion of the substrate 100, the stacking structure of the first semiconductor layers 102 and the second semiconductor layers 104 are patterned into fin structures f by using the hard mask structures 106 as shadow masks. As shown in FIG. 1B, the fin structures f are formed to extend from the substrate 100. In those embodiments where the hard mask structures 106 are arranged along the second direction Y and extending along the first direction X, the formed fin structures f are also arranged along the second direction Y and extending along the first direction X. As shown in FIG. 1B, the fin structures f are formed to separate from each other by a narrower trench T. A method for patterning the top portion of the substrate 100 and the stacking structure to form the fin structures f may include an etching process, such as an anisotropic etching process. The first semiconductor layers 102 are sacrificial layers which are subsequently partially removed, and the second semiconductor layers 104 are subsequently formed into channel layers of the semiconductor device 10.

As depicted in FIG. 1B, each of the fin structures f includes the patterned top portion of the substrate (i.e., a fin substrate 100'), and the patterned stacking structure including the first semiconductor layers 102 and the second semiconductor layers 104 alternately stacked. In detail, the fin structures f have upper portions constituted by the stacked semiconductor layers (i.e., the first semiconductor layers 102 and the second semiconductor layers 104) and lower portions constituted by the fin substrates 100', which also referred to as the lower fin structures. The fin structures f define the active regions of the semiconductor device 10. In FIG. 1B, two fin structures f are arranged in the second direction Y. But the number of the fin structures is not limited to two, and may be as small as one and three or more. In some embodiments, one or more dummy fin structures are formed on both sides of the fin structures f to improve pattern fidelity in the patterning operations. In some embodiments, the two fin structures f are for different types of FETs. In other embodiments, the two fin structures f are for the same type FET.

Figure 1C:
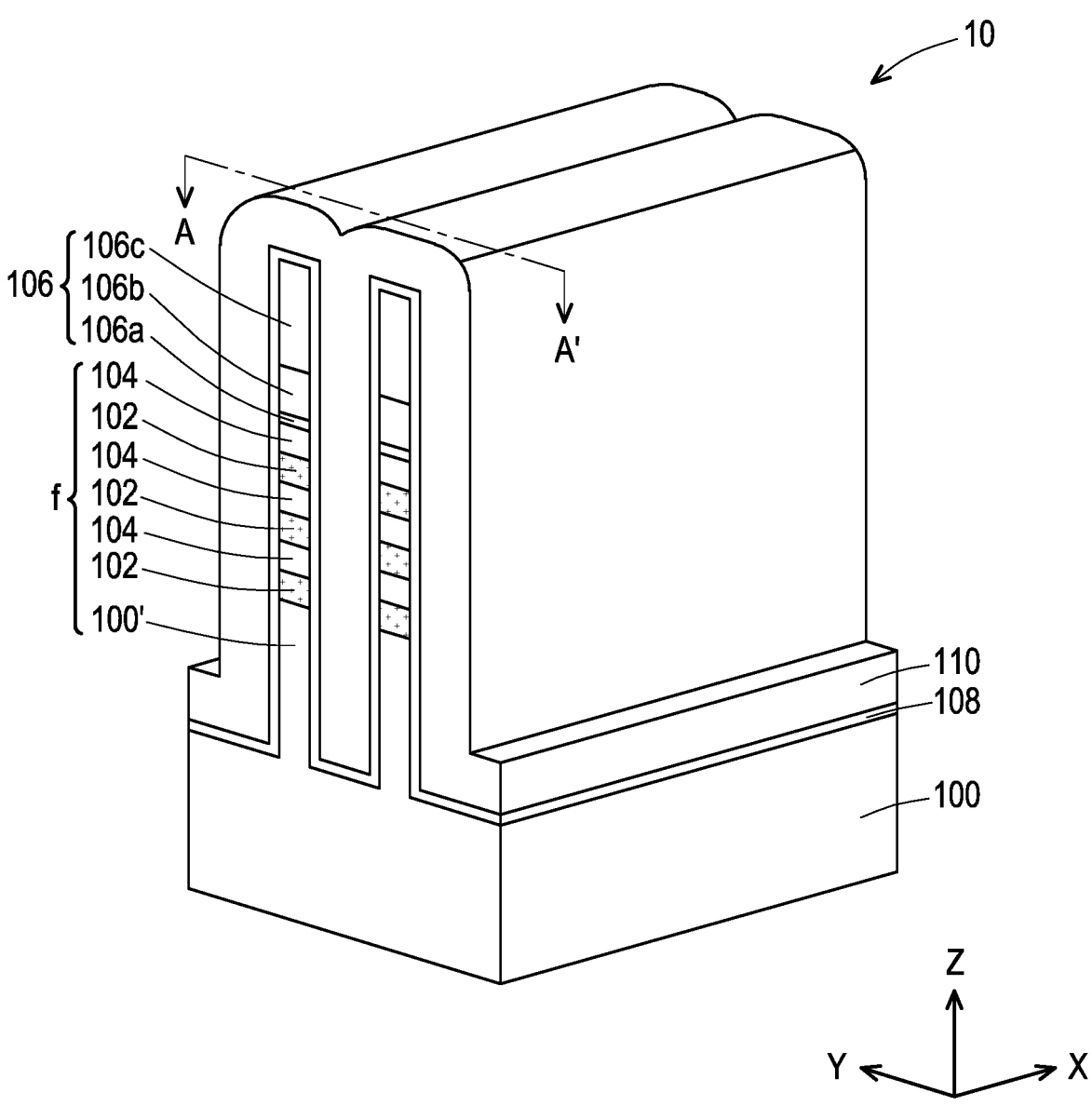

Referring to FIG. 1B, FIG. 1C and FIG. 2, a liner 108 is formed over the substrate 100, and a dielectric wall material 110 is formed over the liner 108 and filling in the trench T. In some embodiments, the liner 108 is conformally deposited over the substrate 100 covering the fin structures f and the trench T. In some embodiments, the material of the liner 108 includes an oxide such as silicon oxide. In some embodiments, a thickness of the liner 108 is between about 1 nm to about 5 nm, or the thickness of the liner 108 is between about 2 nm to about 4 nm. In some embodiments, the dielectric wall material 110 includes $Si_3N_4$, silicon nitride (SiN), silicon carbonitride (SiCN), silicon oxide such as silicon dioxide ($SiO_2$), $Al_2O_3$, AlOx, $HfSiO_4$, $Y_2O_3$, $HfO_2$, $ZrO_2$, $Ta_2O_5$, $La_2O_3$, $LaAlO_3$, $Nb_2O_5$, $TiO_2$, $BaTiO_3$, $SrTiO_3$ or a combination thereof. In various examples, the dielectric wall material 110 is formed by performing a CVD process (such as PECVD process, sub-atmospheric CVD (SACVD) process, or flowable CVD process), an ALD process, or other suitable deposition process. In some embodiments, the dielectric wall material 110 includes a single layer of a dielectric material or a composite layer of multiple dielectric materials.

Figure 1D:
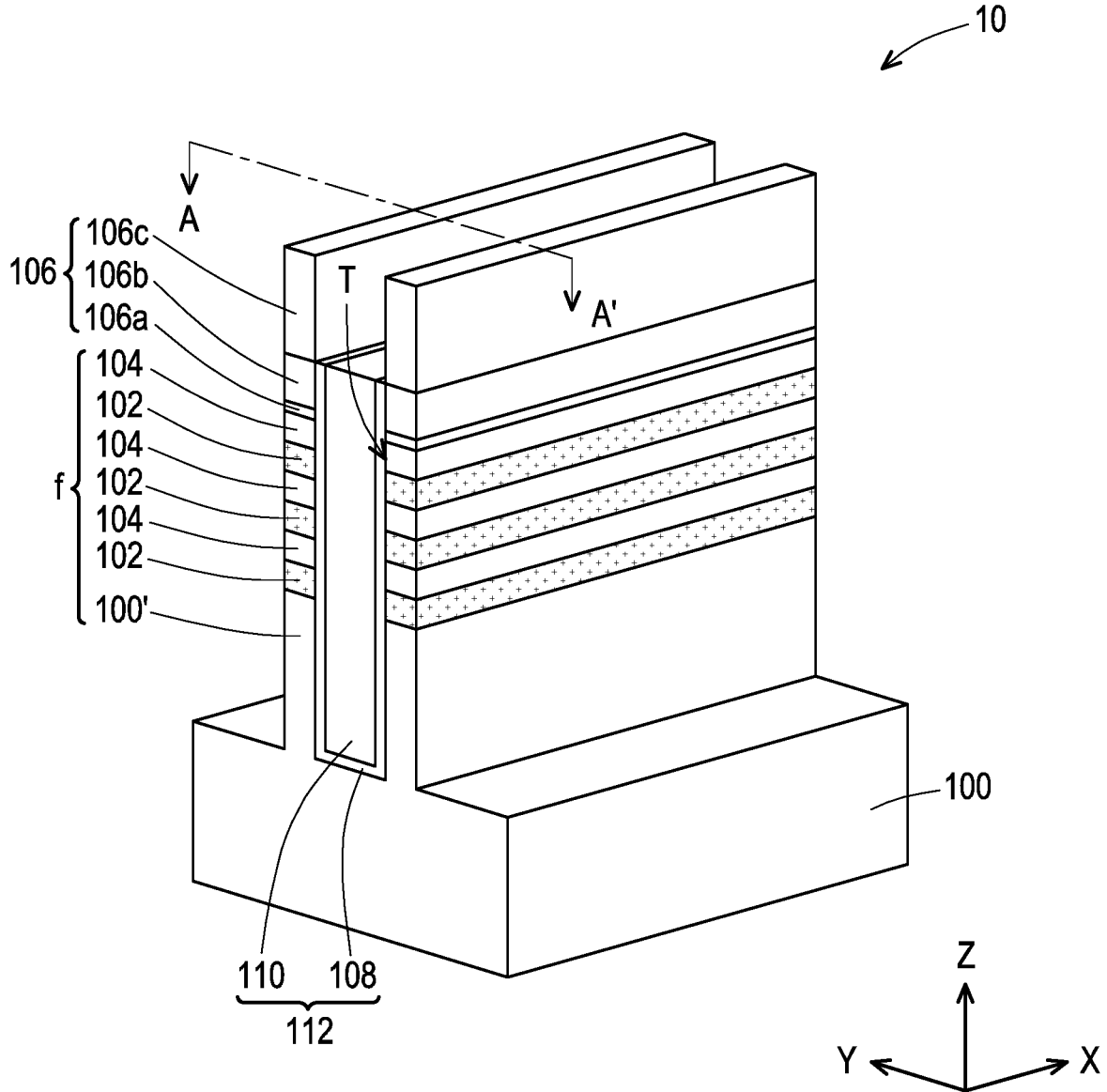

Referring to FIG. 1D and FIG. 3, following the process depicted in FIG. 1C and FIG. 2, in some embodiments, an etch back process is performed to the dielectric wall material 110 and the liner 108 to form a dielectric wall 112 within the trench T. In detail, as shown in FIG. 1D and FIG. 3, the dielectric wall 112 includes the recessed liner 108 located on the sidewalls and bottom surface of the trench T and the recessed dielectric wall material 110 over the recessed liner 108. In some embodiments, a thickness of the dielectric wall 112 is between about 1 Å to about 40 nm. During the etching back process, the dielectric wall material 110 and the liner 108 outside the trench T are removed, and then the substrate 100 and the sidewalls of the fin structures f outside the trench T are exposed. As seen in FIG. 1D and FIG. 3, the illustrated top surface of the dielectric wall 112 is substantially flush and coplanar with the illustrated top surfaces of the pad nitride layers 106b. However, the disclosure is not limited thereto, as long as the dielectric wall 112 is lower than the hard mask layer 106c. Referring to FIG. 1D and FIG. 3, for the dielectric wall 112, the patterned stacking structures each including the first semiconductor layers 102 and the second semiconductor layers 104 alternately stacked beside and located at opposite sides of the dielectric wall 112 may later be respectively fabricated into FETs. As mentioned above, the FETs located at opposite sides of the dielectric wall 112 may be different types of FETs (e.g., one is n-type transistor and another is p-type transistor), or may be the same type FET. Hence, the dielectric wall 112 separating the patterned stacking structures each including the first semiconductor layers 102 and the second semiconductor layers 104 at two opposite sides (the stack pair) serve as an insulator (also an etch stop) between later formed FETs. Further, the dielectric wall 112 allow the second semiconductor layers 104 subsequently formed into channel layers to attach to both opposite sides of the dielectric wall 112 and form forksheet FETs at a later stage.

In some embodiments, etching back process includes at least one dry etching process. In some implementations, the etching back process includes performing a dry etching process using fluorine-based etchants such as hydrogen fluoride (HF), nitrogen trifluoride ($NF_3$), fluorine gas ($F_2$), hexafluorobutadiene ($C_4F_6$), tetrafluoromethane ($CF_4$), trifluoromethane ($CHF_3$), difluoromethane ($CH_2F_2$), hydrogen bromide (HBr), chlorine-based etchants such as chlorine ($Cl_2$), boron trichloride ($BCL_3$), silicon chloride ($SiCl_4$), and/or hydrogen ($H_2$), ammonia ($NH_3$).

Figure 1E:
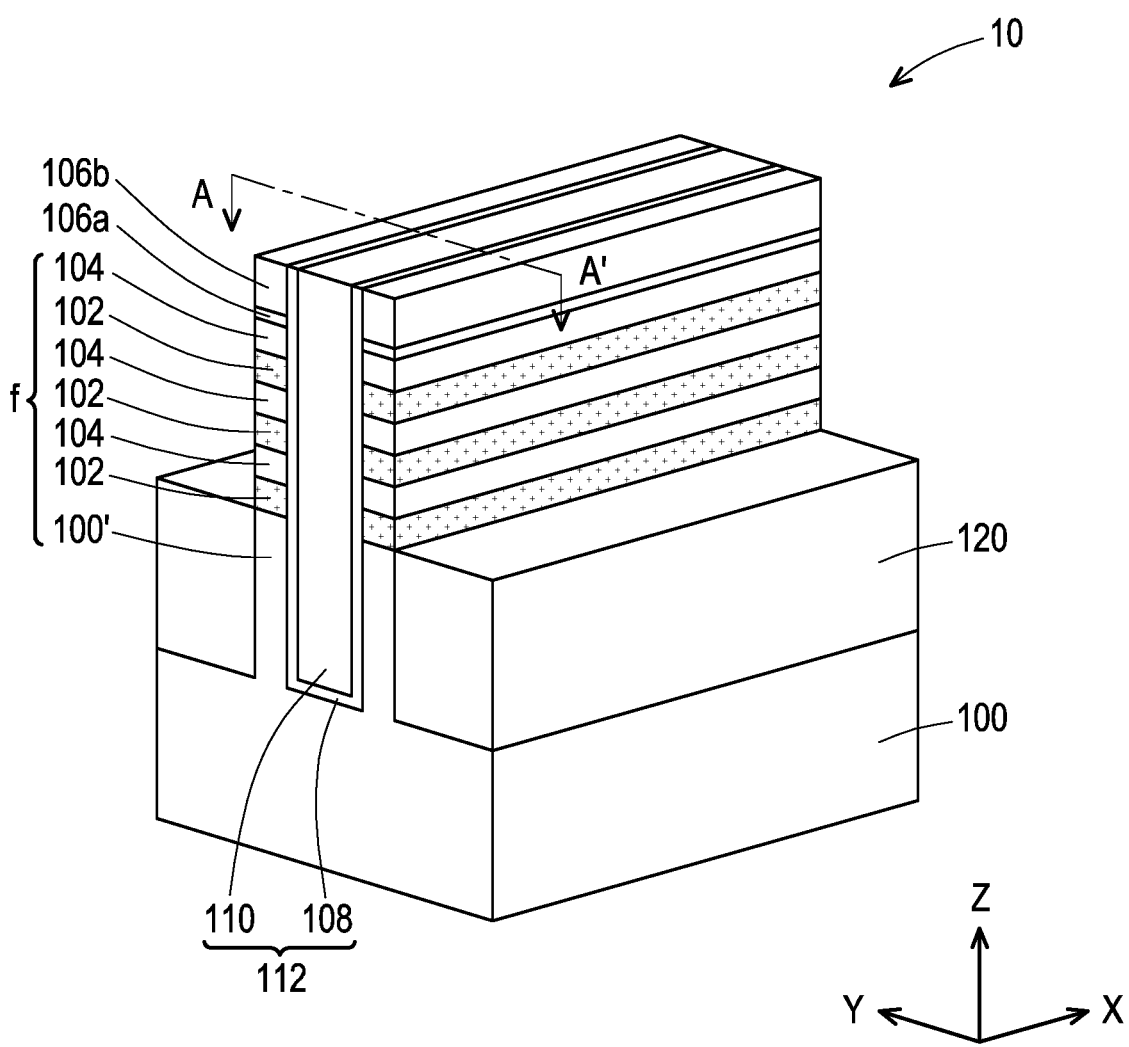

Referring to FIG. 1E and FIG. 4, the hard mask layers 106c (shown in FIG. 1D) are removed, while the dielectric wall 112 is remained. In some embodiments, the hard mask layers 106c is removed by any suitable process, for example, an etching process or a chemical mechanical polishing (CMP) method. Later, continued on FIG. 1E and FIG. 4, after the hard mask layers 106c are removed, an isolation structure 120 is formed to define the active regions of semiconductor device 10. In some embodiments, the isolation structure 120 is also called a shallow trench isolation (STI). In some embodiments, a dielectric material layer, such as silicon oxide, silicon nitride, silicon oxynitride (SiON), SiOCN, SiCN, fluorine-doped silicate glass (FSG), or a low-k dielectric material, is deposited over the substrate 100 along sidewalls of the fin structures f, the pad oxide layers 106a, and the pad nitride layers 106b, so that the fin structures f and the dielectric wall 112 are fully embedded in the dielectric material layer. The dielectric material layer may be deposited by LPCVD process, PECVD process, flowable CVD process, PVD process, thermal oxidation, or other techniques. An anneal operation may be performed after the formation of the dielectric material layer. Then, a planarization operation, such as a CMP method and/or an etch-back method, is performed, such that the illustrated top surface of the dielectric wall 112 and the illustrated top surfaces of the pad nitride layers 106b are exposed from the dielectric material layer. In some embodiments, during the planarization operation, the dielectric material layer is substantially leveled with the dielectric wall 112 and the pad nitride layers 106b. Subsequently, the dielectric material layer is recessed (for example, by etching) to form the isolation structure 120 so that the upper portions of the fin structures f are exposed. In the embodiment shown in FIG. 1E and FIG. 4, the lower fin structures (i.e., fin substrates 100') are covered by the isolation structure 120. As depicted in FIG. 1E and FIG. 4, the illustrated top surface of the isolation structure 120 is substantially flush with the illustrated bottom surface of the bottommost first semiconductor layer 102. However, the disclosure is not limited thereto. In some alternative embodiments, the dielectric material layer is recessed until the top of each of the lower fin structures is exposed. That is to say, in such embodiments, the top surface of the isolation structure 120 is lower than the bottom surface of the bottommost first semiconductor layer 102 (and, thus, is lower than top surfaces of the fin substrates 100'). Further, in some alternative embodiments, the top surface of the isolation structure 120 is higher than the bottom surface of the bottommost first semiconductor layer 102.

In some embodiments, one or more liner layers (not shown) are formed before forming the dielectric material layer. The liner layer is made of SiN or a silicon nitride-based material (e.g., SiON, SiCN or SiOCN). In some embodiments, the liner layer has a thickness between about 1 nm and about 20 nm. In some embodiments, two liner layers are formed over the substrate 100, one of the two liner layers includes silicon oxide and has a thickness between about 0.5 nm and about 5 nm, and another one of the two liner layers includes silicon nitride and has a thickness between about 0.5 nm and about 5 nm. The liner layers may be deposited through one or more processes such as PVD process, CVD process, or ALD, although any acceptable process may be utilized.

Figure 1F:
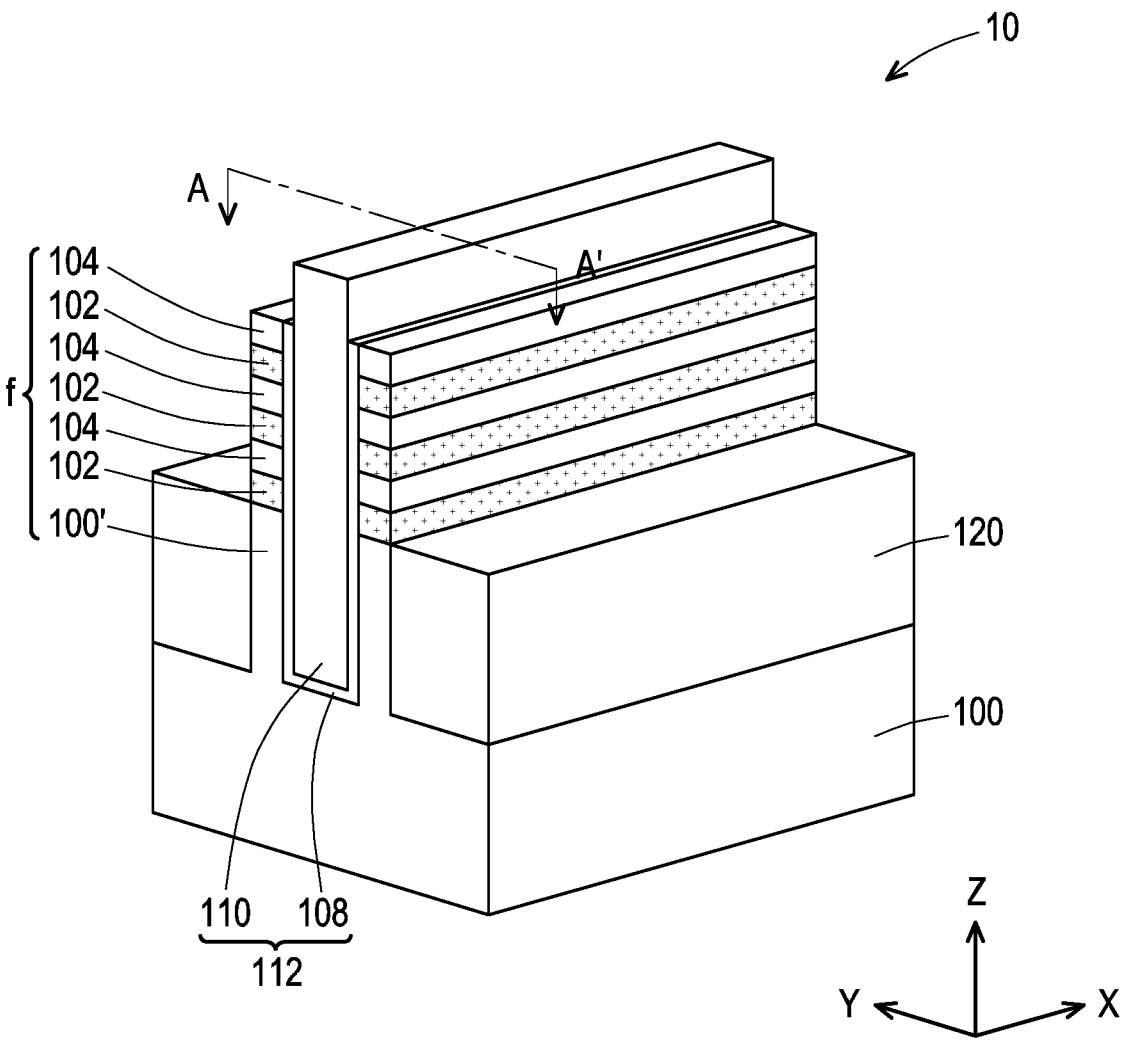

Referring to FIG. 1F and FIG. 5, the pad oxide layers 106a and the pad nitride layers 106b are removed using a plasma etching process, and/or a wet etching process, so that the uppermost second semiconductor layers 104 of the fin structures f are exposed. Further, as shown in FIG. 1F and FIG. 5, portions of the liner 108 protruding from the top surfaces of the uppermost second semiconductor layers 104 along a vertical direction Z perpendicular to the first direction X and the second direction Y are removed with the pad oxide layers 106a and the pad nitride layers 106b. As such, only the dielectric wall material 110 of the dielectric wall 112 protrudes from the top surfaces of the uppermost second semiconductor layers 104 along the vertical direction Z.

That is to say, the illustrated top surface of the dielectric wall material 110 is located at higher height level than the top surfaces of the uppermost second semiconductor layers 104. In other words, the top of the dielectric wall material 110 is located at higher height level than the top of each of the fin structures f.

Figure 1G:
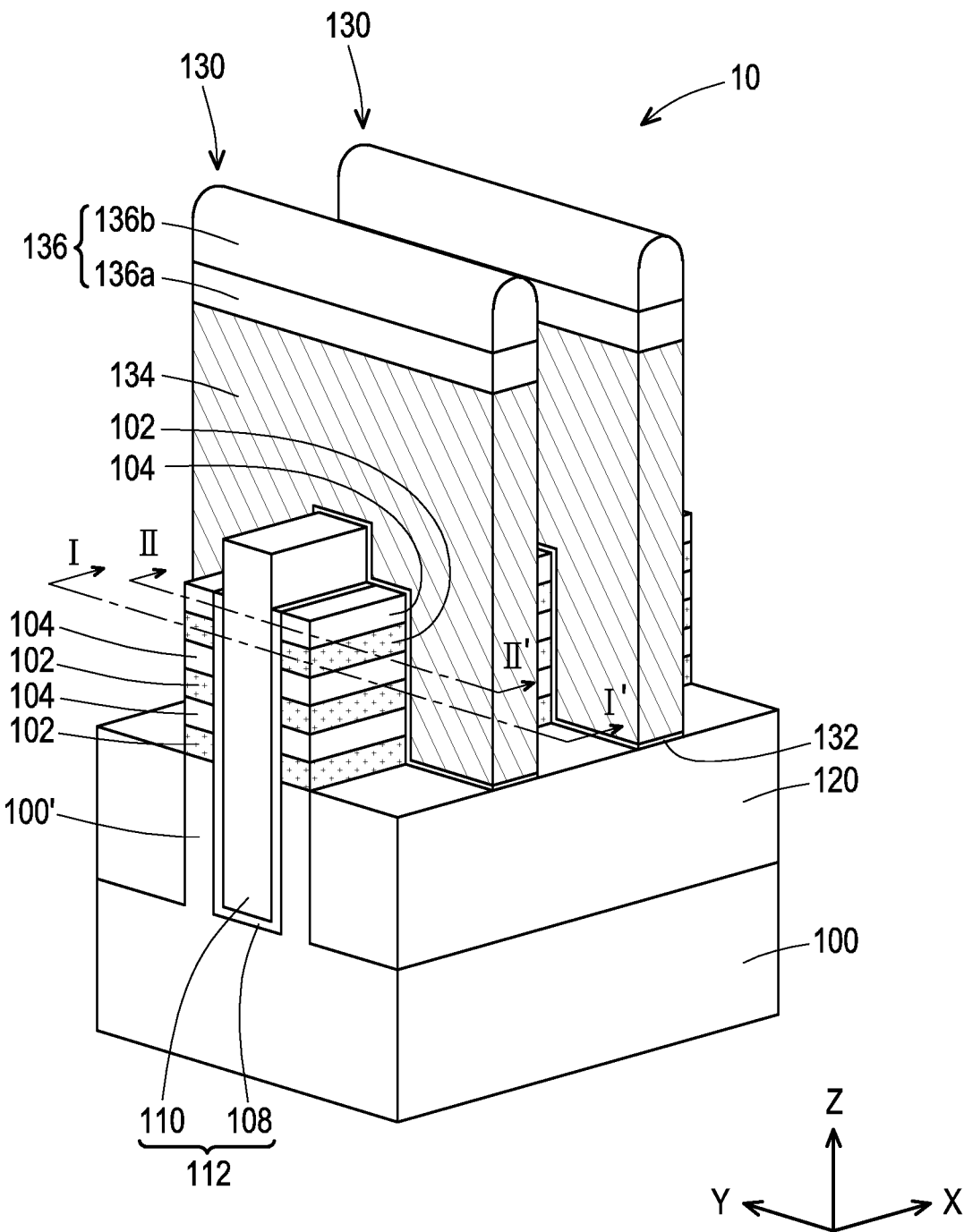

Referring to FIG. 1G, FIG. 6A and FIG. 6B, sacrificial gate structures 130 are formed over the fin structures f, the dielectric wall 112 and the isolation structure 120. An extending direction of the sacrificial gate structures 130 is intersected with an extending direction of the fin structures f, the sacrificial gate structures 130 cover portions of the fin structures f that are overlapped with the sacrificial gate structures 130, and the sacrificial gate structures 130 cover portions of the dielectric wall 112 that are overlapped with the sacrificial gate structures 130. In detail, each sacrificial gate structure 130 is formed over portions of the corresponding fin structures f which are to be channel regions. In other words, the sacrificial gate structure 130 defines the channel region of the semiconductor device 10. In those embodiments where the fin structures f are arranged along the second direction Y and extending along the first direction X, the sacrificial gate structures 130 may be arranged along the first direction X and extend along the second direction Y.

In some embodiments, each sacrificial gate structure 130 includes a sacrificial gate dielectric layer 132 and a sacrificial gate electrode 134. In some embodiments, no sacrificial gate dielectric layer is formed. The sacrificial gate dielectric layer 132 is conformally formed over the fin structures f, the dielectric wall 112 and the isolation structure 120, whereas the sacrificial gate electrode 134 covers the sacrificial gate dielectric layer 132, and are formed to a height greater than a height of the fin structures f and a height of the dielectric wall 112. In some embodiments, each sacrificial gate structure 130 further includes a capping structure 136 lying on the sacrificial gate electrode 134. The capping structure 136 may include a capping layer 136a and a capping layer 136b lying above the capping layer 136a. In some embodiments, the capping layer 136b has rounded top corners. Materials of the sacrificial gate dielectric layer 132, the capping layer 136a and the capping layer 136b may respectively include silicon oxide, silicon nitride, silicon oxynitride, the like or combinations thereof, whereas a material of the sacrificial gate electrode 134 may include polysilicon.

In some embodiments, the formation of the sacrificial gate structures 130 includes sequentially forming a sacrificial gate dielectric material layer, a sacrificial gate electrode layer and capping material layers over the substrate 100, and then patterning the sacrificial gate dielectric material layer, the sacrificial gate electrode layers and the capping material layer. The sacrificial gate dielectric material layer, the sacrificial gate electrode layers are deposited using a CVD process, including LPCVD process and PECVD process, PVD process, ALD, or other suitable process. A photolithography and etching process is performed to pattern the sacrificial gate dielectric material layer, the sacrificial gate electrode layer and the capping material layer to form the sacrificial gate structures 130 over the channel regions of the fin structures f. The photo-lithography process includes photoresist coating (for example, spin-on coating), soft baking, mask aligning, exposure, post-exposure baking, developing the photoresist, rinsing, drying (for example, hard baking), other suitable processes, or combinations thereof. The etching process includes dry etching, wet etching, other etching methods, or combinations thereof. Further, by performing the photo-lithography and etching process to form the sacrificial gate structures 130, a portion of each sacrificial gate structure 130, which is in contact with and near to the fin structures f and the dielectric wall 112, has the dimension along the first direction X gradually decreases as away from the fin structures f and the dielectric wall 112, as shown in FIG. 6A and FIG. 6B. However, the disclosure is not limited thereto. In some alternative embodiments, the sacrificial gate structure 130 has the consistent dimension along the first direction X.

By patterning the sacrificial gate structures 130, the upper portions of the fin structures f with the first semiconductor layers 102 and the second semiconductor layers 104 are partially exposed on opposite sides of each sacrificial gate structure 130, thereby defining source/drain (S/D) regions, as shown in FIG. 1G. In this disclosure, a source and a drain are interchangeably used and the structures thereof are substantially the same. In FIG. 1G, two sacrificial gate structures 130 are arranged in the second direction X. But the number of the sacrificial gate structures is not limited to two, and may be as small as one and three or more. In certain embodiments, one or more dummy sacrificial gate structures are formed on both sides of the sacrificial gate structures to improve pattern fidelity.

Figure 1H:
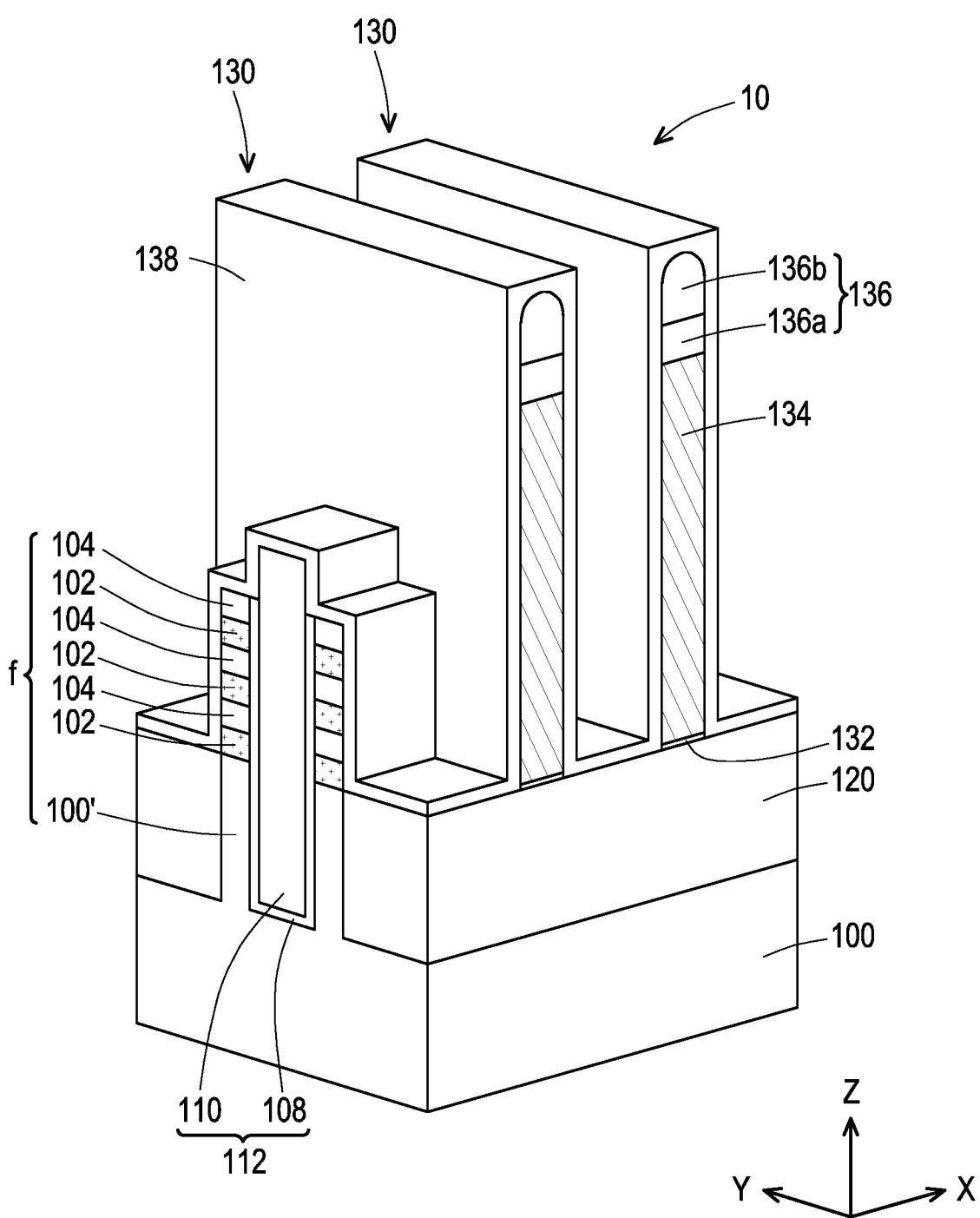

Referring to FIG. 1H, a gate spacer layer 138 is formed on the current structure. In some embodiments, the gate spacer layer 138 is globally formed over the structure as shown in FIG. 1G. In these embodiments, the isolation structure 120, the fin structures f, the dielectric wall 112 and the sacrificial gate structures 130 may be conformally covered by the gate spacer layer 138. A material of the gate spacer layer 138 may include silicon oxide, silicon nitride, silicon carbide, silicon oxynitride, SiCN, silicon oxycarbide, SiOCN, the like or combinations thereof, and a method for forming the gate spacer layer 138 may include a deposition process, such as a CVD process or an ALD process. In some embodiments, the gate spacer layer 138 is deposited to a thickness in a range from about 2 nm to about 10 nm. In the embodiment shown in FIG. 1H, the gate spacer layer 138 is a single layer. However, the disclosure is not limited thereto. In some alternative embodiments, the gate spacer layer 138 includes a multi-layer structure, such as a first dielectric layer that includes silicon nitride and a second dielectric layer that includes silicon oxide.

Figure 1I:
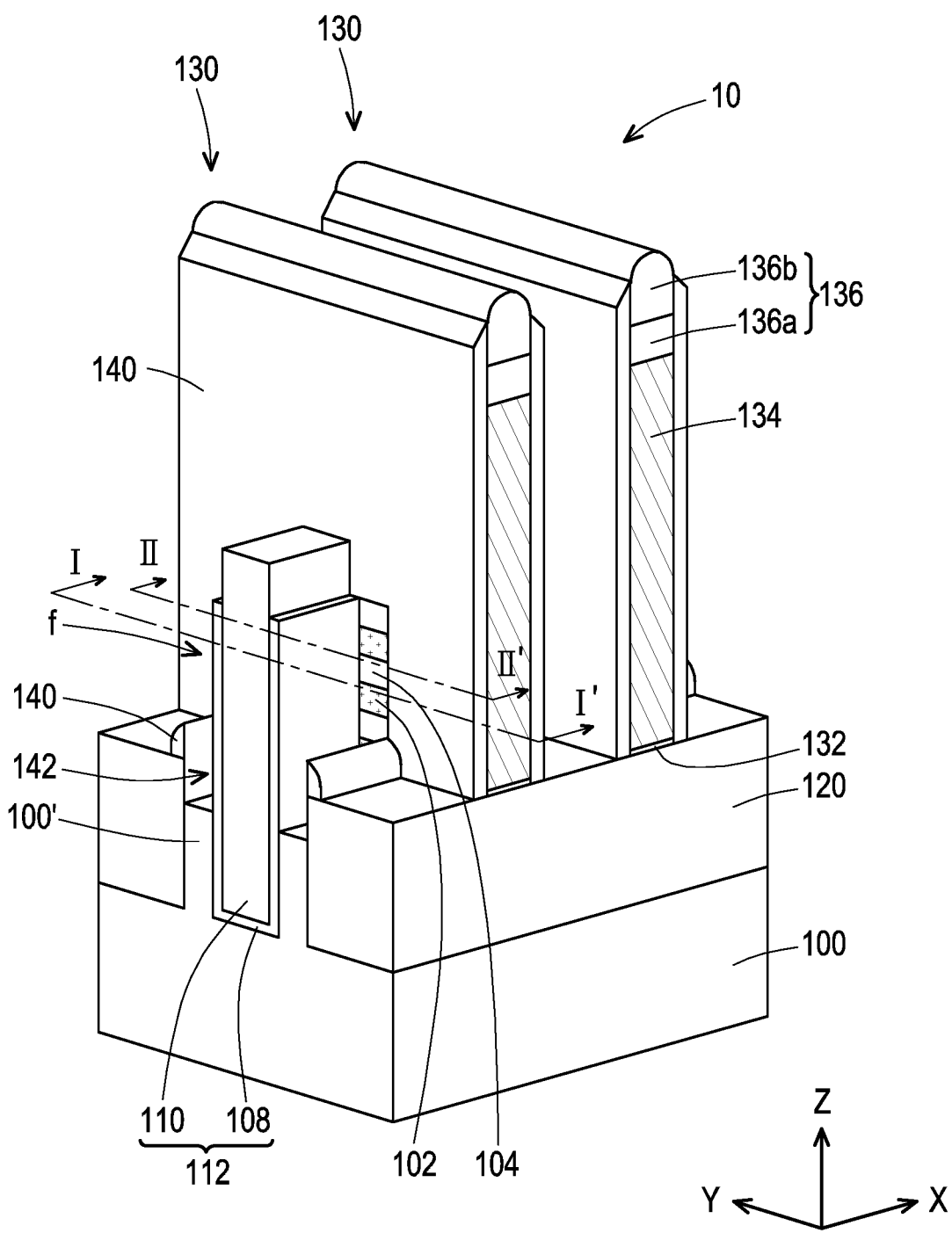

Referring to FIG. 1I, FIG. 7A and FIG. 7B, after the gate spacer layer 138 is formed, an etching process is performed on the gate spacer layer 138. In some embodiments, the etching process is an anisotropic etching process. During the etching process, most of the gate spacer layer 138 is removed from horizontal surfaces, leaving the sidewall spacers 140 on the vertical surfaces such as the sidewalls of the sacrificial gate structures 130 and the sidewalls of the exposed fin structures f. That is to say, portions of the gate spacer layer 138 in the X-Y plane are removed and portions of the gate spacer layer 138 along the vertical direction Z remain substantially unchanged and form the sidewall spacers 140. The sidewall spacers 140 formed on the sidewalls of the sacrificial gate structures 130 are also referred to as gate spacers. As shown in FIG. 1I, the capping structure 136 (e.g., the capping layer 136b) is exposed from the sidewall spacers 140. In some embodiments, isotropic etching may be subsequently performed to remove portions of the sidewall spacers 140 from the upper portions of the S/D regions of the exposed fin structures f. In some embodiments, a thickness of the sidewall spacers 140 is about 1 nm to about 10 nm.

Subsequently, still referring to FIG. 1I, FIG. 7A and FIG. 7B, the fin structures f of the S/D regions are recessed down below the top surface of the isolation structure 120 to form recesses 142. The S/D recessed process may be performed by using dry etching and/or wet etching. As shown in FIG. 1I, FIG. 7A and FIG. 7B, the sidewall spacers 140 formed on the S/D regions of the exposed fin structures f partially remain, and the portions of the liner 108 in contact with the S/D regions of the exposed fin structures f are exposed. In such embodiments, as shown in FIG. 1I, the recess 142 is formed between the remained sidewall spacer 140 and the dielectric wall 112 (e.g., the exposed liner 108). However, the disclosure is not limited thereto. In some alternative embodiments, the sidewall spacers 140 formed on the S/D regions of the exposed fin structures f are fully removed. As depicted in FIG. 1 I, each of the recesses 142 includes one sidewall formed by the isolation structure 120, another sidewall formed by the liner 108 and a bottom surface formed by a top surface of the corresponding fin substrate 100'. Further, at this stage, end portions of the stacking structure of the first and second semiconductor layers 102, 104 under the sacrificial gate structures 130 have substantially flat faces which are flush with the sidewall spacers 140, as shown in FIG. 1I, FIG. 7A and FIG. 7B. In some embodiments, the end portions of the stacking structure of the first and second semiconductor layers 102, 104 are slightly horizontally etched.

Figure 1J:
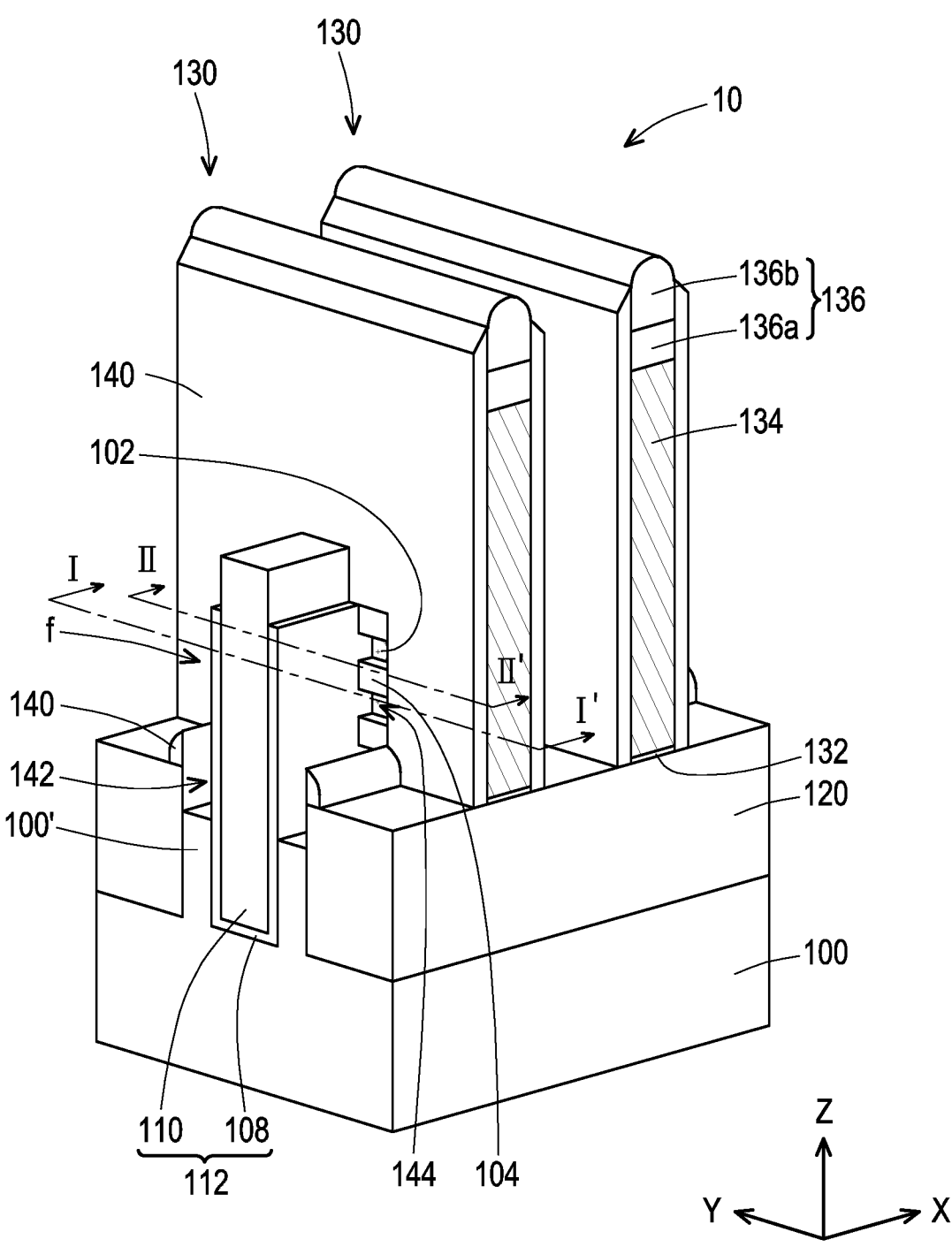

Referring to FIG. 1J, FIG. 8A and FIG. 8B, the first semiconductor layers 102 are laterally recessed from the second semiconductor layers 104 and the sidewall spacers 140 formed on the sidewalls of the sacrificial gate structures 130 (i.e., the gate spacers). As such, recesses 144 are formed at sidewalls of the remained portions of the fin structures f, and are formed to expose portions of the liner 108 in contact with the remained portions of the fin structures f. From another point of view, the recesses 144 are formed between the second semiconductor layers 104 and between the bottommost second semiconductor layers 104 and the fin substrates 100', such that portions (edges) of the second semiconductor layers 104 are suspended. In some embodiments, the first semiconductor layers 102 are laterally recessed from the gate spacers by a distance d1 along the first direction X ranging from about 2 nm to about 10 nm, as shown in FIG. 8A. A method for lateral recessing the first semiconductor layers 102 may include an etching process, such as an isotropic etching process. By properly selecting etchants for the etching process and/or by properly selecting the materials of the first semiconductor layers 102 and the second semiconductor layers 104, the first semiconductor layers 102 can be etched without consuming the second semiconductor layers 104 and other components in the current structure. As discussed above, in some embodiments, the first semiconductor layers 102 include SiGe, and the second semiconductor layers 104 include Si.

In some embodiments, the first semiconductor layers 102 are laterally recessed (etched) so that edges of the first semiconductor layers 102 are located substantially below a side face of the sacrificial gate electrode 134. In some embodiments, end portions (edges) of the first semiconductor layers 102 under the sacrificial gate structure are substantially flush with the side faces of the sacrificial gate electrode 134. Here, "being substantially flush" means the difference in the relative position is less than about 1 nm. In some embodiments, during the recess etching of the first semiconductor layers 102 and/or the recess etching of the fin structures f of the S/D regions as described with FIG. 1I, end portions of the second semiconductor layers 104 are also laterally etched. The recessed amount of the first semiconductor layers 102 is greater than the recessed amount of the second semiconductor layers 104. In some embodiments, the second semiconductor layers 104 are laterally recessed from the gate spacers by a distance along the first direction X ranging from about 1 nm to about 4 nm, and the difference of the distance d1 by which the first semiconductor layers 102 are laterally recessed from the gate spacers and the distance by which the second semiconductor layers 104 are laterally recessed from the gate spacers is in a range from about 1 nm to about 9 nm.

Referring to FIG. 1K, FIG. 9A, FIG. 9B and FIG. 9C, after the recesses 144 are formed, the liner 108 is removed to form recesses 146 communicating with the recesses 144. In detail, referring to FIG. 1J, FIG. 8A, FIG. 8B, FIG. 1K, FIG. 9A, FIG. 9B and FIG. 9C, the recesses 146 are formed by removing the portions of the liner 108 exposed during the formation of the recesses 142, the portions of the liner 108 exposed during the formation of the recesses 144, and portions of the liner 108 near to and in contact with the second semiconductor layers 104. A method for removing the liner 108 may include an etching process, such as an isotropic etching process. By properly selecting etchants for the etching process and/or by properly selecting the materials of the liner 108, the first semiconductor layers 102 and the second semiconductor layers 104, the liner 108 can be etched without consuming the first semiconductor layers 102, the second semiconductor layers 104 and other components in the current structure. As discussed above, in some embodiments, the liner 108 includes an oxide, the first semiconductor layers 102 include SiGe, and the second semiconductor layers 104 include Si.

Figure 1K:
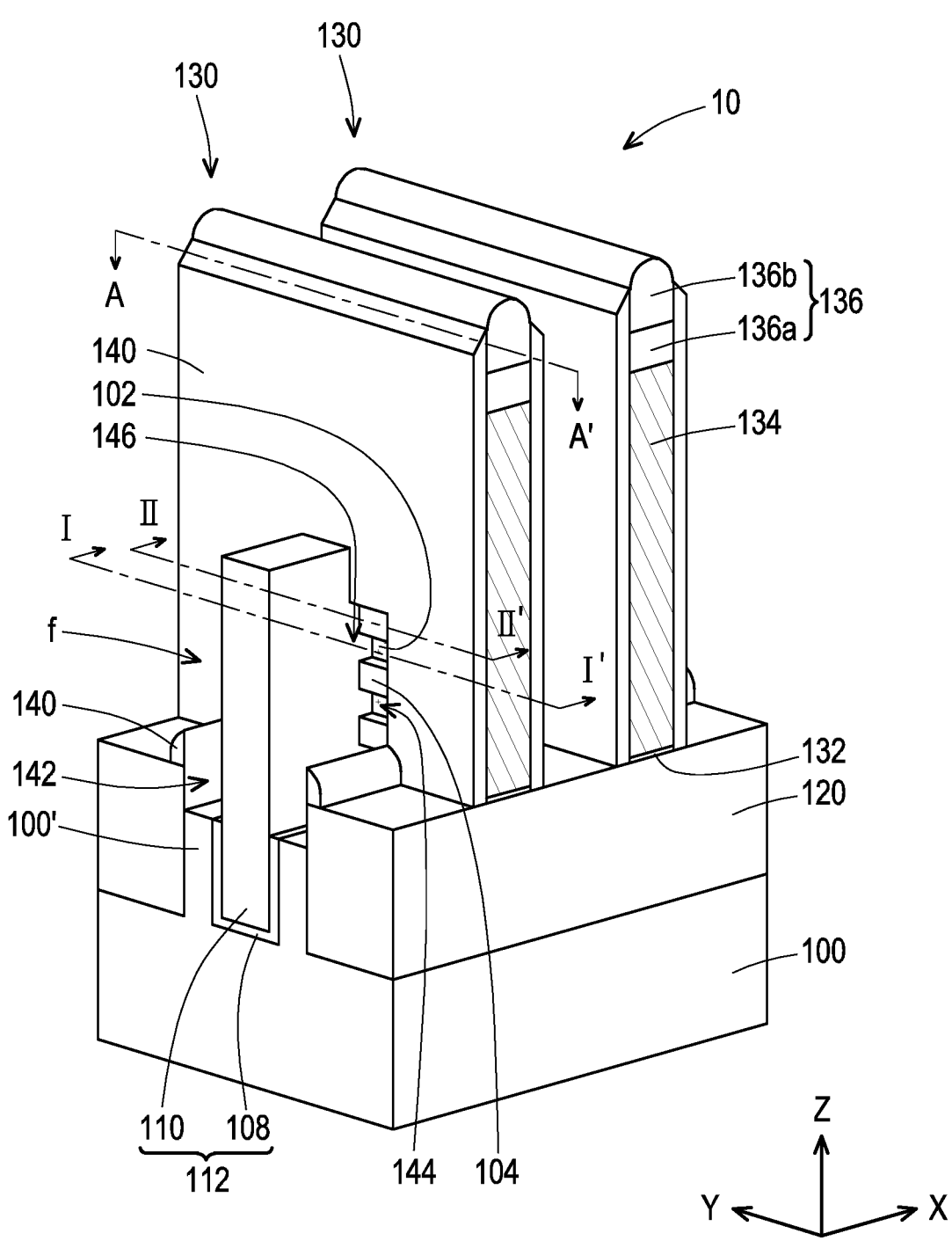

In some embodiments, as shown in FIG. 1K, FIG. 9A, FIG. 9B and FIG. 9C, each recess 146 is formed between the dielectric wall 112 and the second semiconductor layers 104 of the corresponding fin structure f. From another point of view, each recess 146 is formed to exposed the dielectric wall 112 and the second semiconductor layers 104 of the corresponding fin structure f. Further, in some embodiments, as shown in FIG. 1K and FIG. 9C, each recess 146 is formed to extend vertically and continuously along the sidewall of the dielectric wall 112 in the vertical direction Z. Further, in some embodiments, as shown in FIG. 9C, each of the recesses 146 includes a bottom surface formed by a top surface of the liner 108, wherein the top surface of the liner 108 is substantially flush and coplanar with the top surface of the fin substrate 100'. However, the disclosure is not limited thereto. In some alternative embodiments, the bottom surface of the recess 146 is located at higher or lower height level than the top surface of the fin substrate 100'. In some embodiments, as shown in FIG. 1K, FIG. 9A and FIG. 9B, the liner 108 is laterally removed from the gate spacers by a distance d2 along the first direction X as the same as the distance d1 by which the first semiconductor layers 102 are laterally recessed from the gate spacers. In some embodiments, the distance d2 ranges from about 2 nm to about 10 nm. However, the disclosure is not limited thereto. In some alternative embodiments, there is a slight distance difference to a neglectable degree along the first direction X between the distance d2 by which the liner 108 is laterally removed from the gate spacers and the distance d1 by which the first semiconductor layers 102 are laterally recessed from the gate spacers.

Figure 1L:
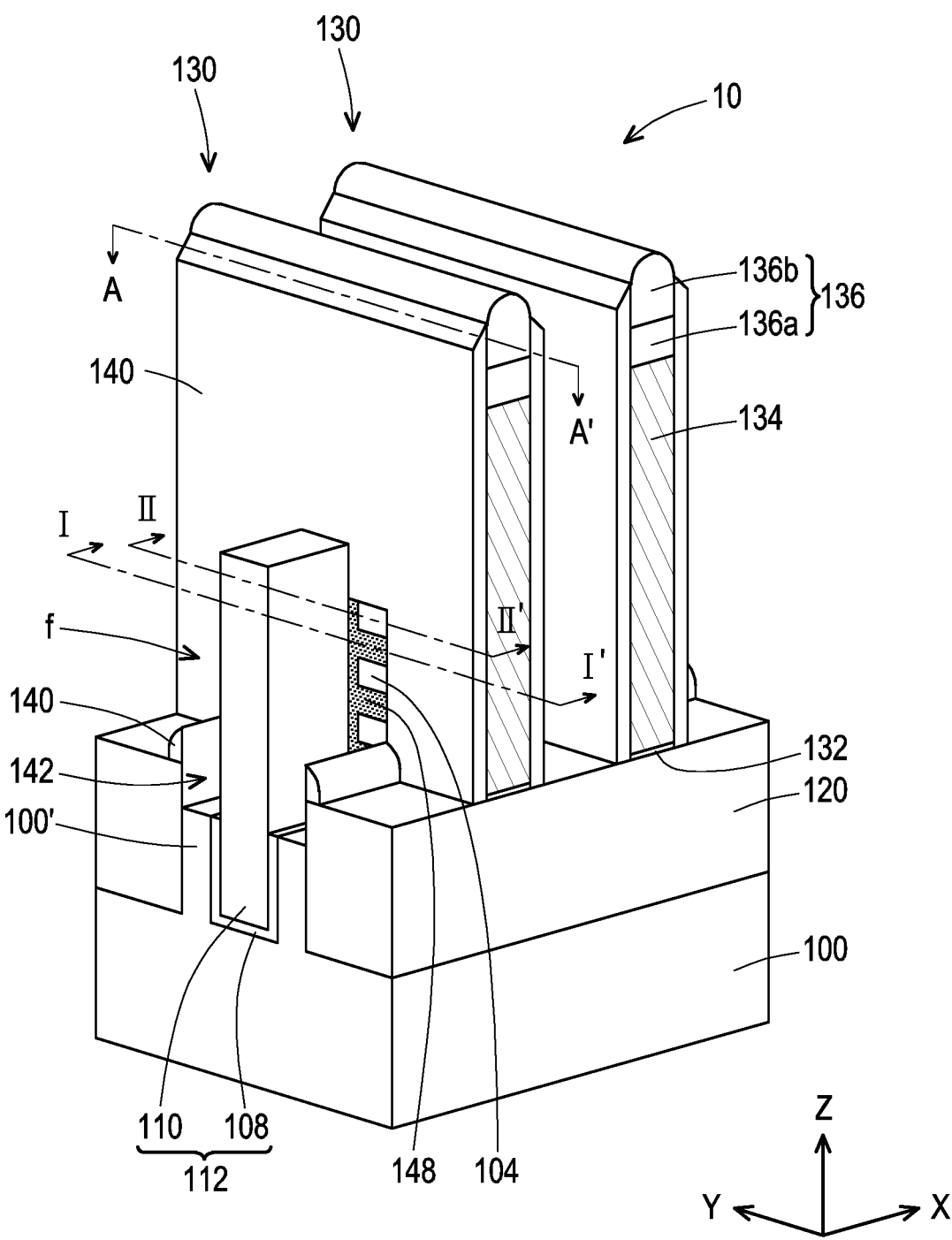

Referring to FIG. 1L, FIG. 10A, FIG. 10B and FIG. 10C, an insulating material is filled into the recesses 144 at the sidewalls of the fin structures f and the recesses 146 to form inner spacers 148. In some embodiments, as shown in FIG. 1L, FIG. 10A and FIG. 10B, exposed surfaces of the inner spacers 148 are substantially flush and coplanar with exposed surfaces of the second semiconductor layers 104 and sidewalls of the gate spacers. However, the disclosure is not limited thereto. In some alternative embodiments, the exposed surfaces of the inner spacers 148 are dented from the exposed surfaces of the second semiconductor layers 104 and sidewalls of the gate spacers.

A material of the insulating material for forming the inner spacers 148 may include silicon oxide such as silicon dioxide ($SiO_2$), silicon nitride (SiN), silicon carbonitride (SiCN), $Si_3N_4$, $Al_2O_3$, AlOx, $HfSiO_4$, $Y_2O_3$, $HfO_2$, $ZrO_2$, $Ta_2O_5$, $La_2O_3$, $LaAlO_3$, $Nb_2O_5$, $TiO_2$, $BaTiO_3$, $SrTiO_3$ or combinations thereof. In some embodiments, a method for forming the inner spacers 148 may include the following steps. Initially, a first deposition process is performed to form an insulating material layer globally covering the structure shown in FIG. 1K. In various examples, the first deposition process includes a CVD process (such as PECVD process, sub-atmospheric CVD (SACVD) process, or flowable CVD process), an ALD process, or other suitable deposition process. Then, an anneal process is performed once the insulating material layer is formed. Afterwards, an etching process is performed on the insulating material layer. In some embodiments, the etching process performed is selective to the dielectric material of the insulating material layer. For example, the etching process includes a CERTAS® etching process. Thereafter, a second deposition process is performed to form another insulating material layer globally covering the structure after the etching process is performed. In various examples, the second deposition process includes a CVD process (such as PECVD process, sub-atmospheric CVD (SACVD) process, or flowable CVD process), an ALD process, or other suitable deposition process. Finally, portions of the insulating material layer outside the recesses 144 and the recesses 146 are removed, so that the remained portions of the insulating material layer form the inner spacers 148. In some embodiments, the portions of the insulating material layer are removed by using an etching process (e.g., an anisotropic etching process). In this way, the overhang issue can be avoided even each recess 146 formed by removing the liner 108 with the thickness ranging between about 1 nm to about 5 nm is narrow.

Figure 16:
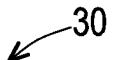
FIG. 16 illustrates a schematic cross-sectional view of a semiconductor device in accordance with some alternative embodiments of the disclosure.
Figure 17A:
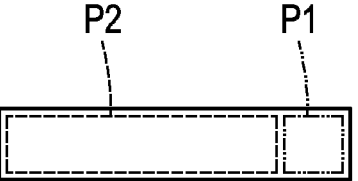
FIGS. 17A-17G respectively are schematic cross-sectional views of a semiconductor device in accordance with some alternative embodiments of the disclosure.
Figure 17B:
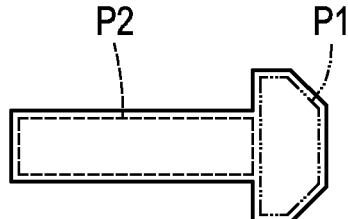
Figure 17C:
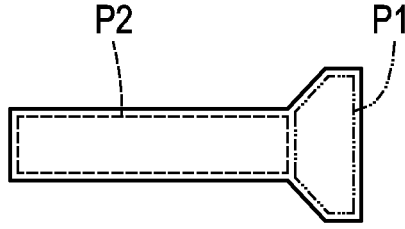
Figure 17D:
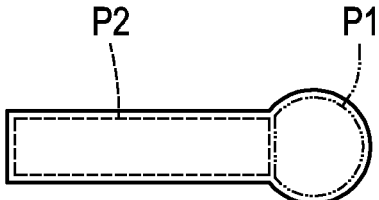
Figure 17E:
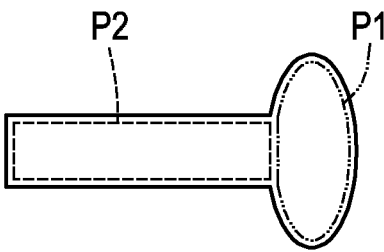
Figure 17F:
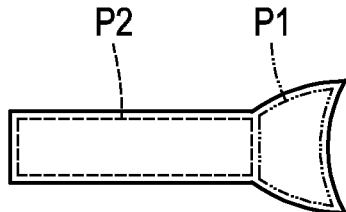
Figure 17G:
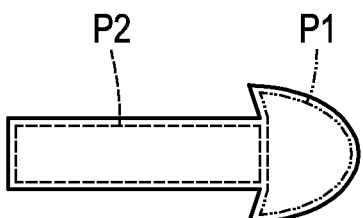

In some embodiments, as shown in FIG. 10A, FIG. 10B and FIG. 10C, each inner spacer 148 includes a first portion P1 and a second portion P2 connected with the first portion P1, wherein the first portion P1 extends vertically and continuously along the sidewall of the dielectric wall 112 in the vertical direction Z, and the second portion P2 comprises patterns each horizontally arranges between the second semiconductor layers 104 and between the bottommost second semiconductor layers 104 and the fin substrates 100'. However, the disclosure is not limited thereto. In some alternative embodiments, as shown in FIG. 16, in the semiconductor device 30, the first portion P1 of the inner spacer 148 comprises discrete patterns each connected with the corresponding pattern of the second portion P2. In such embodiments, the recesses 146 formed corresponding to the same fin structure f are separated from each other via the remained portions of the liner 108. In detail, the adjacent patterns of the first portion P1 along the vertical direction Z are spaced apart from each other by a distance ranging from greater than about 0 nm to about 10 nm. That is, the remained portions of the liner 108 between the adjacent patterns of the first portion P1 along the vertical direction Z has a dimension ranging from greater than about 0 nm to about 10 nm. It is noted that by arranging the adjacent patterns of the first portion P1 along the vertical direction Z spaced apart from each other by a distance ranging from greater than about 0 nm to about 10 nm, leakage paths and extrusion paths for the later-formed gate electrodes 158 can be prevented. Further, as shown in FIG. 16, each pattern of the first portion P1 has a rectangle shaped cross-section with a long side along the vertical direction Z. However, the cross-section shape of each pattern of the first portion P1 is not limited to FIG. 16. In some alternative embodiments, each pattern of the first portion P1 may have other cross-section shapes as shown in FIG. 17A to FIG. 17G.

Referring to FIG. 1M, FIG. 11A, FIG. 11B, FIG. 11C and FIG. 11D, S/D electrodes 150 are formed from the recesses 142 (in FIG. 1L). The sacrificial gate structures 130 are respectively located between a pair of the S/D electrodes 150, and are separated from the S/D electrodes 150 by the gate spacers. In addition, the second semiconductor layers 104 and the inner spacers 148 covered by each sacrificial gate structure 130 are in lateral contact with a pair of the S/D electrodes 150. Further, the S/D electrodes 150 are formed to be in contact with the dielectric wall 112. In some embodiments, as shown in FIG. 11C and FIG. 11D, the S/D electrodes 150 are spaced apart from the liner 108 made of an oxide by the inner spacers 148. That is, the inner spacer 148 is disposed between the corresponding liner 108 and the corresponding S/D electrode 150. In the embodiment shown in FIG. 1M and FIG. 11B, the top surfaces of the S/D electrodes 150 are higher than the top surface of the stacking structure of the first and second semiconductor layers 102, 104 (i.e., the top surface of the topmost second semiconductor layer 104). However, the disclosure is not limited thereto. In some alternative embodiments, the top surfaces of the S/D electrodes 150 are substantially coplanar with the top surface of the stacking structure of the first and second semiconductor layers 102, 104.

The S/D electrodes 150 may include a semiconductor material such as silicon (Si) or germanium (Ge); a compound semiconductor such as silicon germanium (SiGe), silicon carbide (SiC), silicon phosphide (SiP), silicon phosphide carbide (SiCP), gallium arsenide (GaAs), gallium phosphide (GaP), indium phosphide (InP), indium arsenide (InAs), indium antimonide (InSb); an alloy semiconductor such GaAsP, AlInAs, AlGaAs, InGaAs, GaInP, and/or GaInAsP; or combinations thereof. For example, the S/D electrodes 150 includes one or more layers of Si, SiP, SiC and SiCP for an n-channel FET or Si, SiGe, Ge for a p-channel FET.

In some embodiments, the S/D electrodes 150 are formed by an epitaxial process. In these embodiments, the S/D electrodes 150 may be grown from the fin substrates 100' exposed by the recesses 142. The epitaxy process may include CVD deposition (for example, vapor-phase epitaxy (VPE), ultra-high vacuum CVD (UHV-CVD) process, LPCVD process, and/or PECVD process), molecular beam epitaxy, other suitable SEG processes, or combinations thereof. It is noted that the present disclosure is not limited to the shapes of the S/D electrodes 150 shown in FIG. 1M, and the S/D electrodes 150 may be actually formed as other shapes.

Still referring to FIG. 1M, FIG. 11A, FIG. 11B, FIG. 11C and FIG. 11D, a liner layer 152 and an interlayer dielectric (ILD) layer 154 are formed over the substrate 100. The liner layer 152 may include any suitable dielectric material, such as SiO, SiON, SiN, SiCN, SiOC, SiOCN, and may be formed by any suitable method, such as ALD, CVD process, PVD process, other suitable methods, or combinations thereof. The liner layer 152 functions as a contact etch stop layer (CESL) in the subsequent etching operations. As illustrated in FIG. 1M, FIG. 11B, FIG. 11C and FIG. 11D, the liner layer 152 is conformally formed over the isolation structure 120. In detail, as shown in FIG. 1M, FIG. 11B, FIG. 11C and FIG. 11D, the liner layer 152 is disposed along the gate spacers and covers the S/D electrodes 150. In other words, the liner layer 152 has a conformal profile over the S/D electrodes 150 (e.g., having about the same thickness on outer surfaces of S/D electrodes 150). In some embodiments, the liner layer 152 has a thickness of about 1 nm to about 10 nm. The ILD layer 154 is formed over the liner layer 152. The ILD layer 154 includes a low-k dielectric material, such as tetraethylorthosilicate (TEOS), un-doped silicate glass, or doped silicon oxide (SiO) such as boro-phosphosilicate glass (BPSG), fused silica glass (FSG), phosphosilicate glass (PSG), boron doped silicon glass (BSG), other suitable dielectric materials, or combinations thereof. The ILD layer 154 may include a multi-layer structure having multiple dielectric materials. The ILD layer 154 may be formed by a deposition process such as flowable CVD process, spin-on-glass (SOG), other suitable methods, or combinations thereof.

Figure 1M:
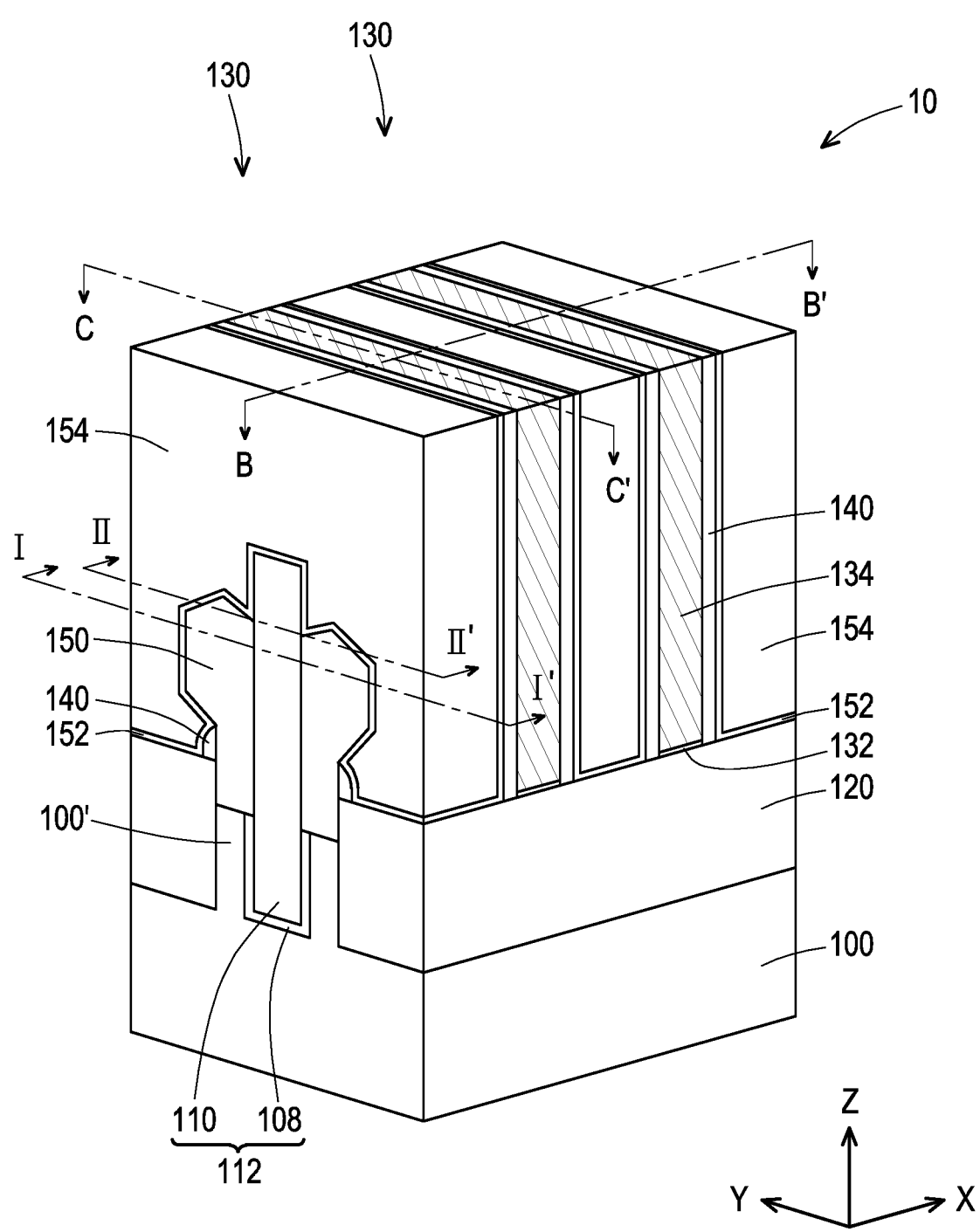

Further, still referring to FIG. 1M, FIG. 11A and FIG. 11B, after the ILD layer 154 is formed, a planarization operation, such as a CMP method, is performed to planarize the top surface of the semiconductor device 10. As illustrated in FIG. 1M, FIG. 11A and FIG. 11B, during the planarization operation, the capping structures 136 of the sacrificial gate structures 130 are removed, so that the sacrificial gate electrodes 134 are exposed.

Figure 12A:
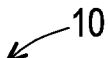
Figure 12A:
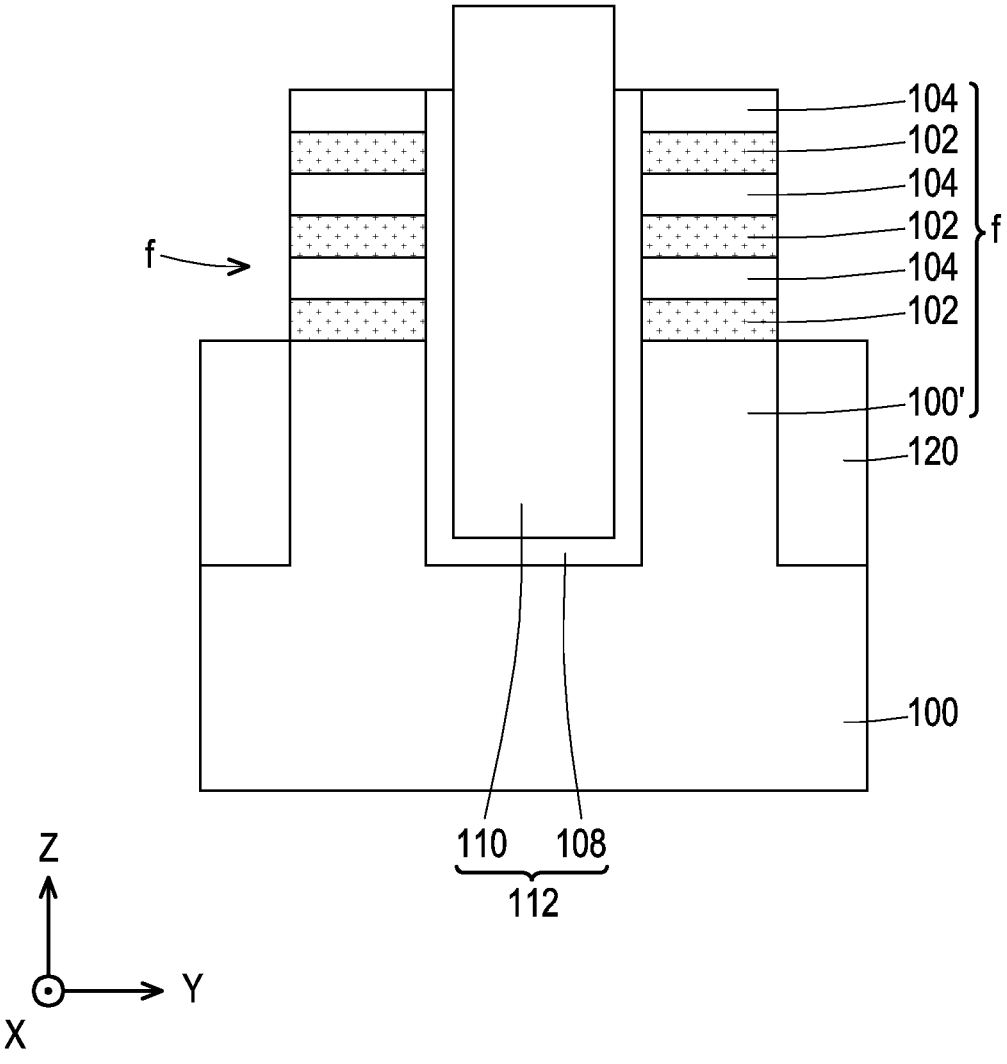
Figure 12B:
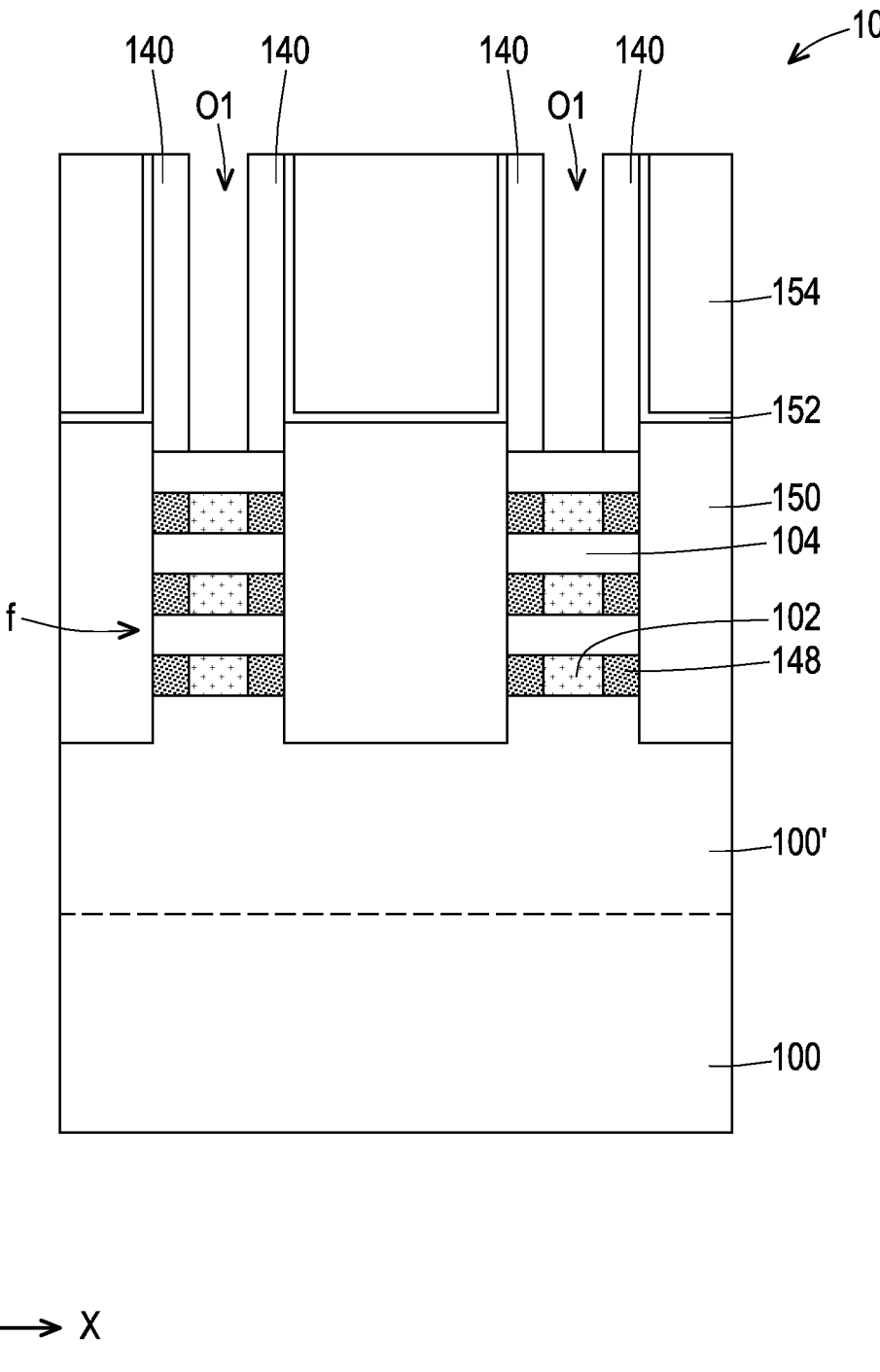
Figure 12C:
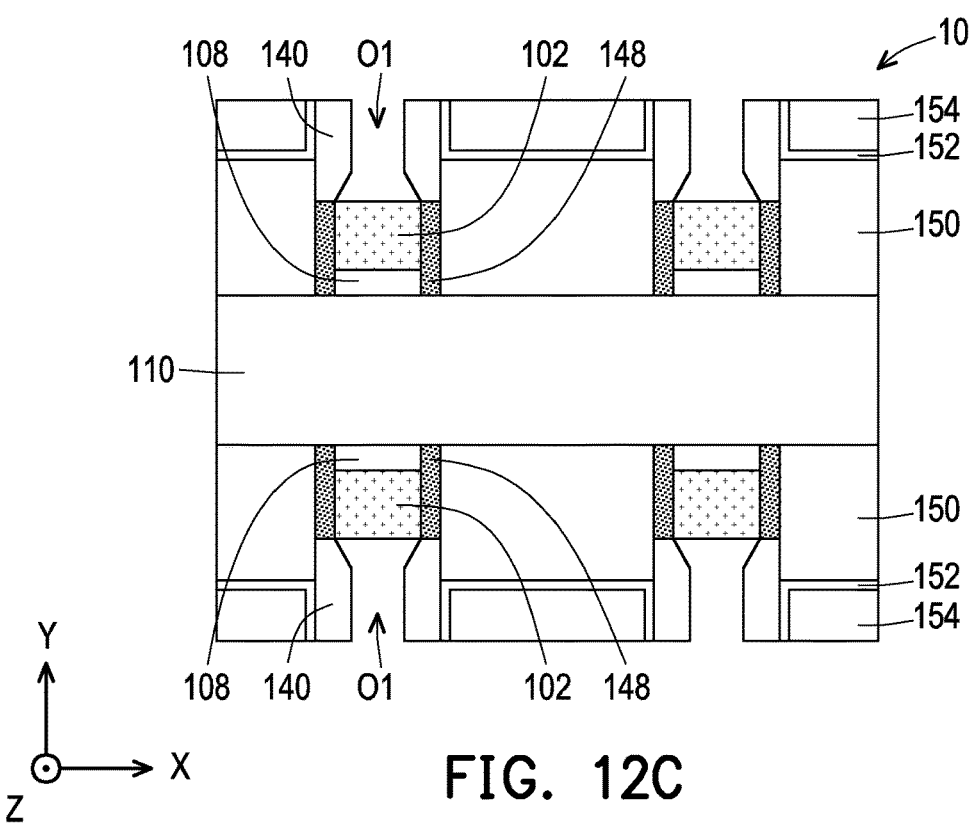
Figure 12D:
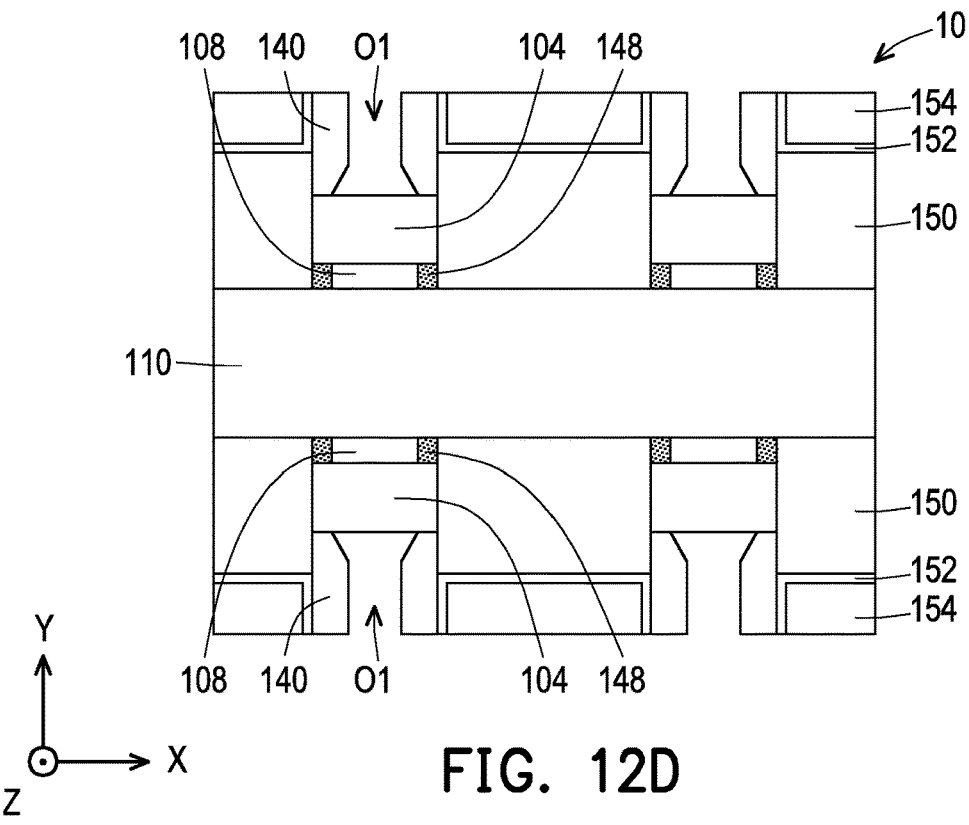

Referring to FIG. 12A, FIG. 12B, FIG. 12C and FIG. 12D, the sacrificial gate dielectric layers 132 and the sacrificial gate electrodes 134 are removed, so as to form gate trenches O1 each between the corresponding sidewall spacers 140 (i.e., gate spacers). In some embodiments, the sacrificial gate electrodes 134 are removed by etching process. The etching process includes dry etching, wet etching, other etching methods, or combinations thereof. As shown in FIG. 12A, the first semiconductor layers 102 and the second semiconductor layers 104 previously covered by the sacrificial gate structures 130 are currently exposed in the gate trenches O1. Further, as shown in FIG. 12B, during the removing process, the sidewall spacers 140 remain substantially intact while the sacrificial gate dielectric layers 132 and the sacrificial gate electrodes 134 are totally removed. This is because the specific etching selectivity is chosen based on the material differences between the sidewall spacers 140 and the sacrificial gate electrodes 134, and between the sidewall spacers 140 and the sacrificial gate dielectric layers 132. In some embodiments, for the etchant used in the removing process of the sacrificial gate electrodes 134, the etching selectivity of the material of the sidewall spacers 140 to the material of the sacrificial gate electrodes 134 is larger than about 100.

Figure 13A:
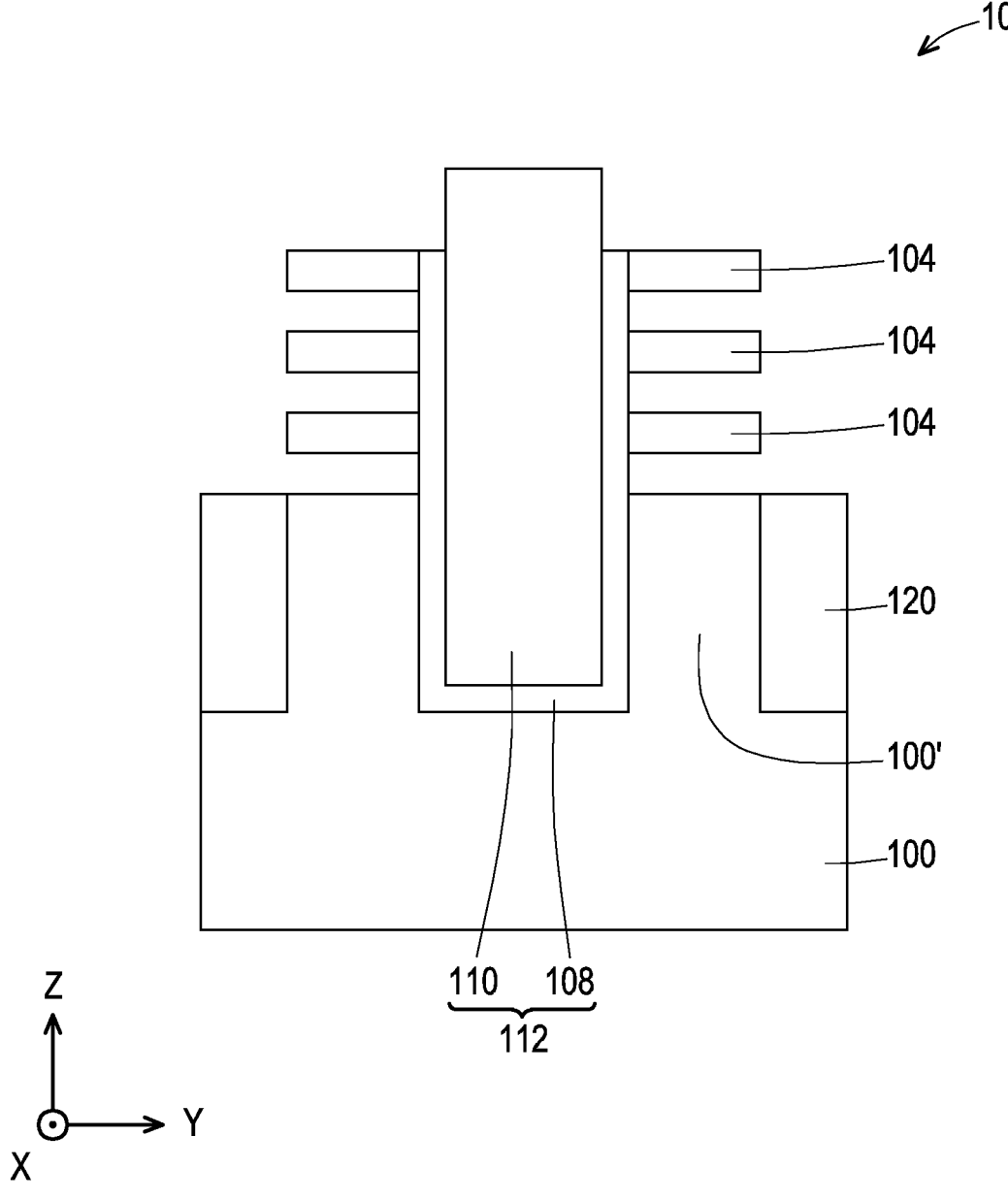
Figure 13B:
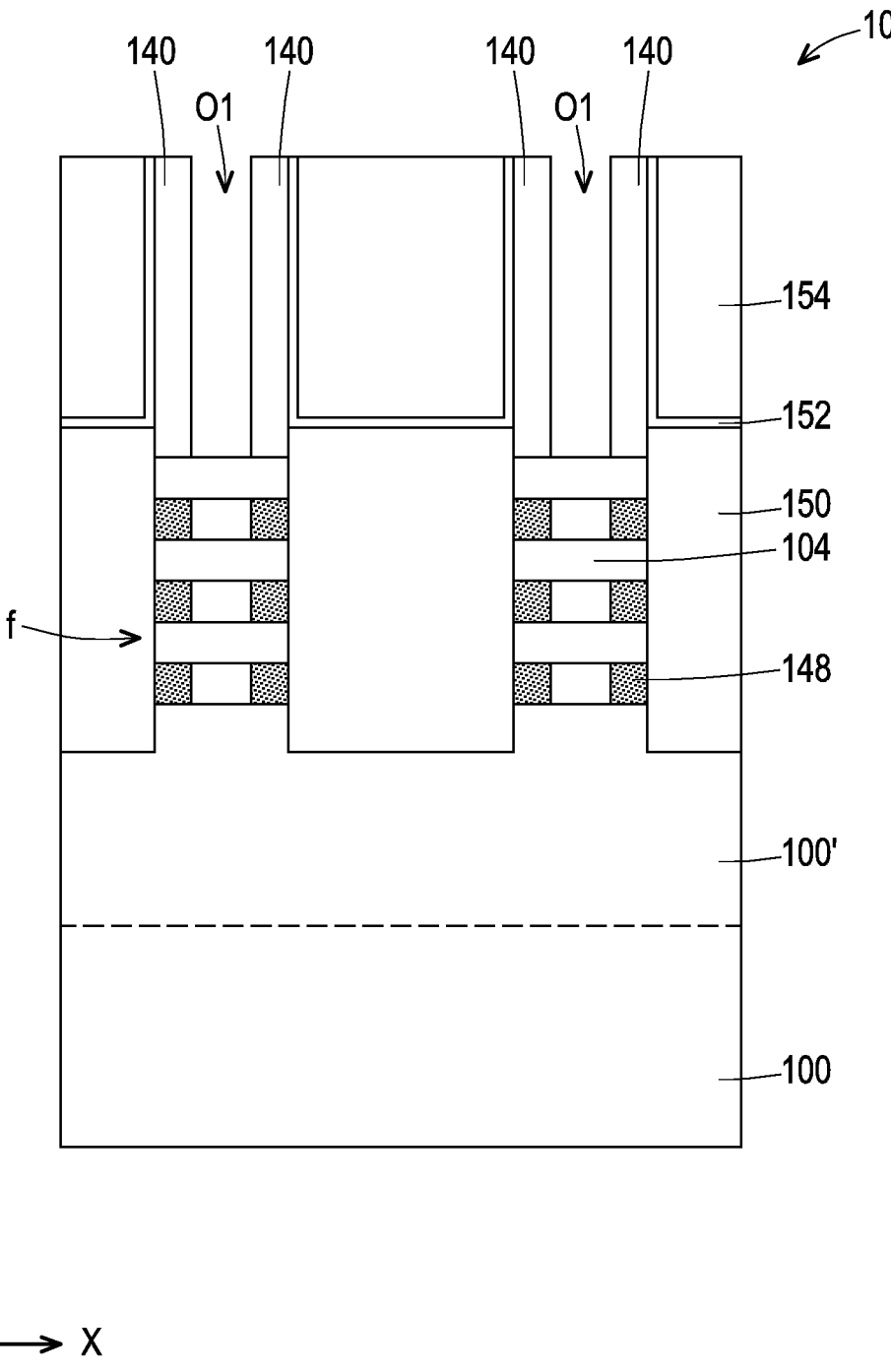
Figure 13C:
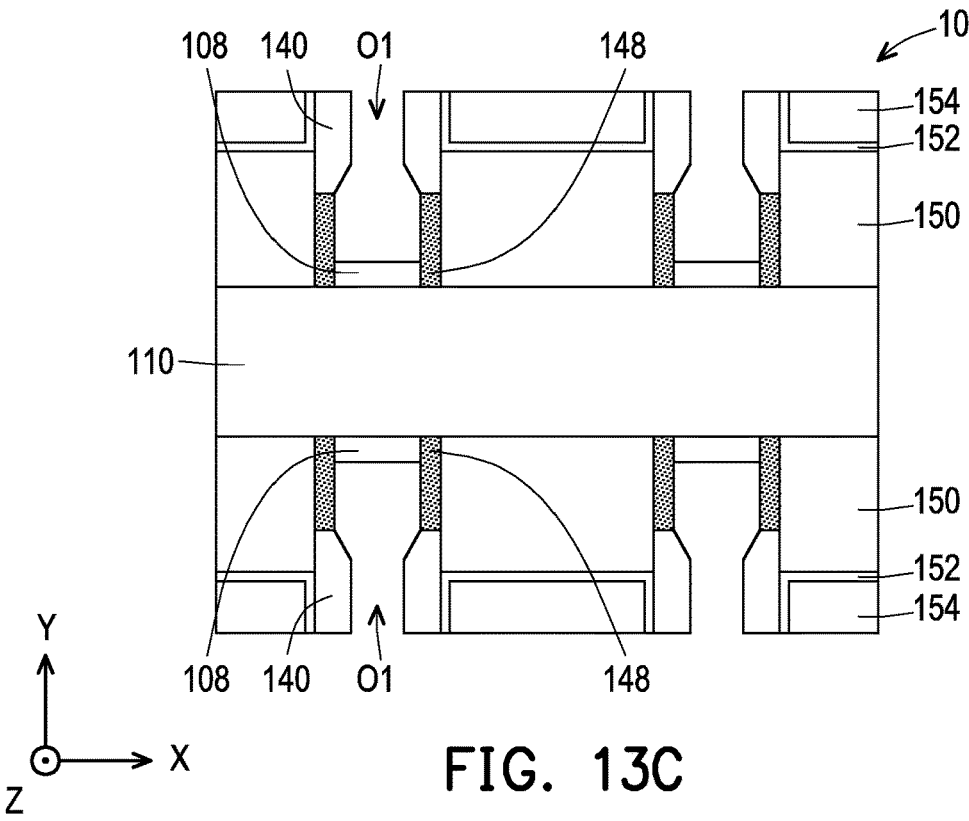
Figure 13D:
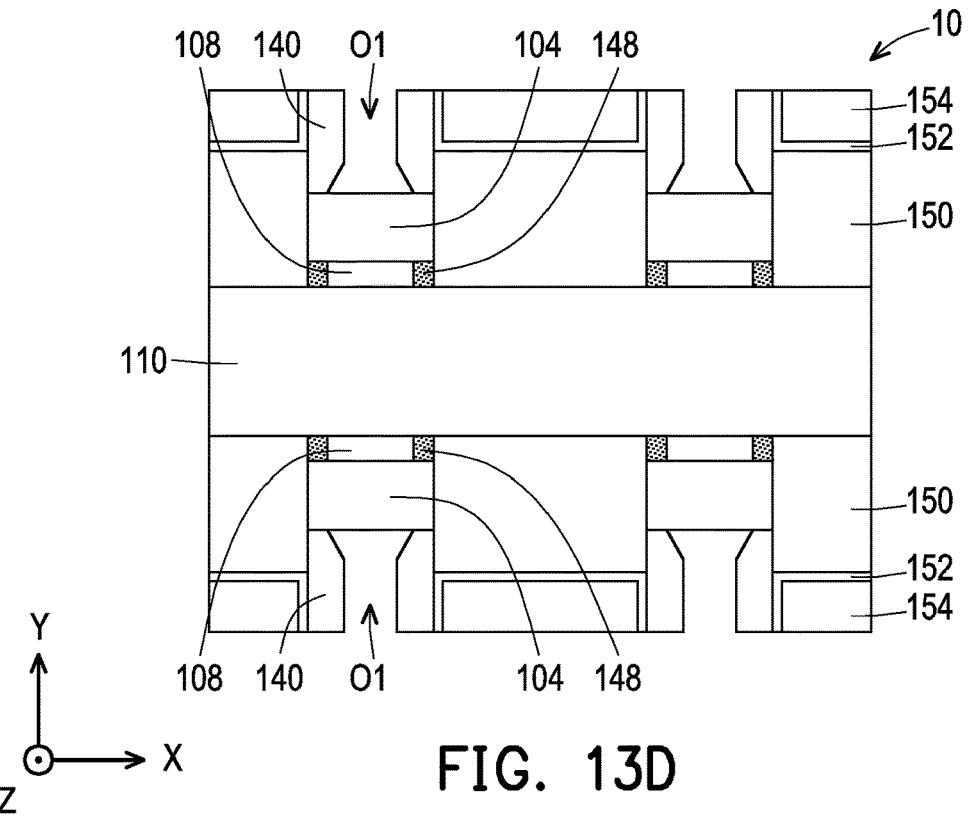

Referring to FIG. 13A, FIG. 13B, FIG. 13C and FIG. 13D, after the gate trenches O1 are formed, the first semiconductor layers 102 are removed from the gate trenches O1. As a result, surfaces of the second semiconductor layers 104 not contact with the dielectric wall 112 and the S/D electrodes 150, functioning as channel regions, are exposed and released in the gate trenches O1. As such, the removal process of the first semiconductor layers 102 is also referred to as a channel release process. Form another point of view, as shown in FIG. 13A, the second semiconductor layers 104 are suspended, and the suspended second semiconductor layers 104 are collectively referred to as a nanostructure. In some embodiments, the second semiconductor layers 104 are slightly etched or not etched depending on the design of the semiconductor device 10. For example, the second semiconductor layers 104 may be slightly etched to form a wire-like shape (for nanowire transistors); the second semiconductor layers 104 may be slightly etched to form a sheet-like shape (for nanosheet transistors); or the second semiconductor layers 104 may be slightly etched to form other geometrical shape (for other nanostructure transistors). In addition, as shown in FIG. 13B, FIG. 13C and FIG. 13D, portions of the inner sidewalls of the inner spacers 148 previously covered by the first semiconductor layers 102 are currently exposed in the gate trenches O1.

In some embodiments, the first semiconductor layers 102 are removed by a selective etching process that is tuned to remove only the first semiconductor layers 102 while the second semiconductor layers 104 and the inner spacers 148 remain substantially unchanged. The selective etching may be a selective wet etching, a selective dry etching, or a combination thereof. The selective etching may be performed by properly selecting etchants for the etching process and/or properly selecting the materials of the first semiconductor layers 102 and the second semiconductor layers 104. In some embodiments, the selective wet etching process may include a HF or $NH_4OH$ etchant. In some embodiments, the selective removal of first semiconductor layers 102 may include an oxidation process (for example, to form oxidized semiconductor layers comprising SiGeOx) followed by an oxidation removal (for example, SiGeOx removal).

In some embodiments, the exposed portions of the second semiconductor layers 104 are optionally trimmed. The trimming reduces the thicknesses of the exposed portions of the second semiconductor layers 104. For example, the trimming can reduce the thickness of the second semiconductor layers 104 by an amount in the range of about 40% to about 70%. The trimming may be performed concurrently with the channel release process, or may be performed after the channel release process is performed. For example, the exposed portions of the second semiconductor layers 104 may be trimmed by an acceptable etching process that selectively etches the material(s) of the second semiconductor layers 104 at a faster rate than the materials of other components in the current structure (e.g., the inner spacers 148, the gate spacers, and/or the dielectric wall material 110). In some embodiments, the etching process includes a chemical oxide removal (COR) process.

Figure 14A:
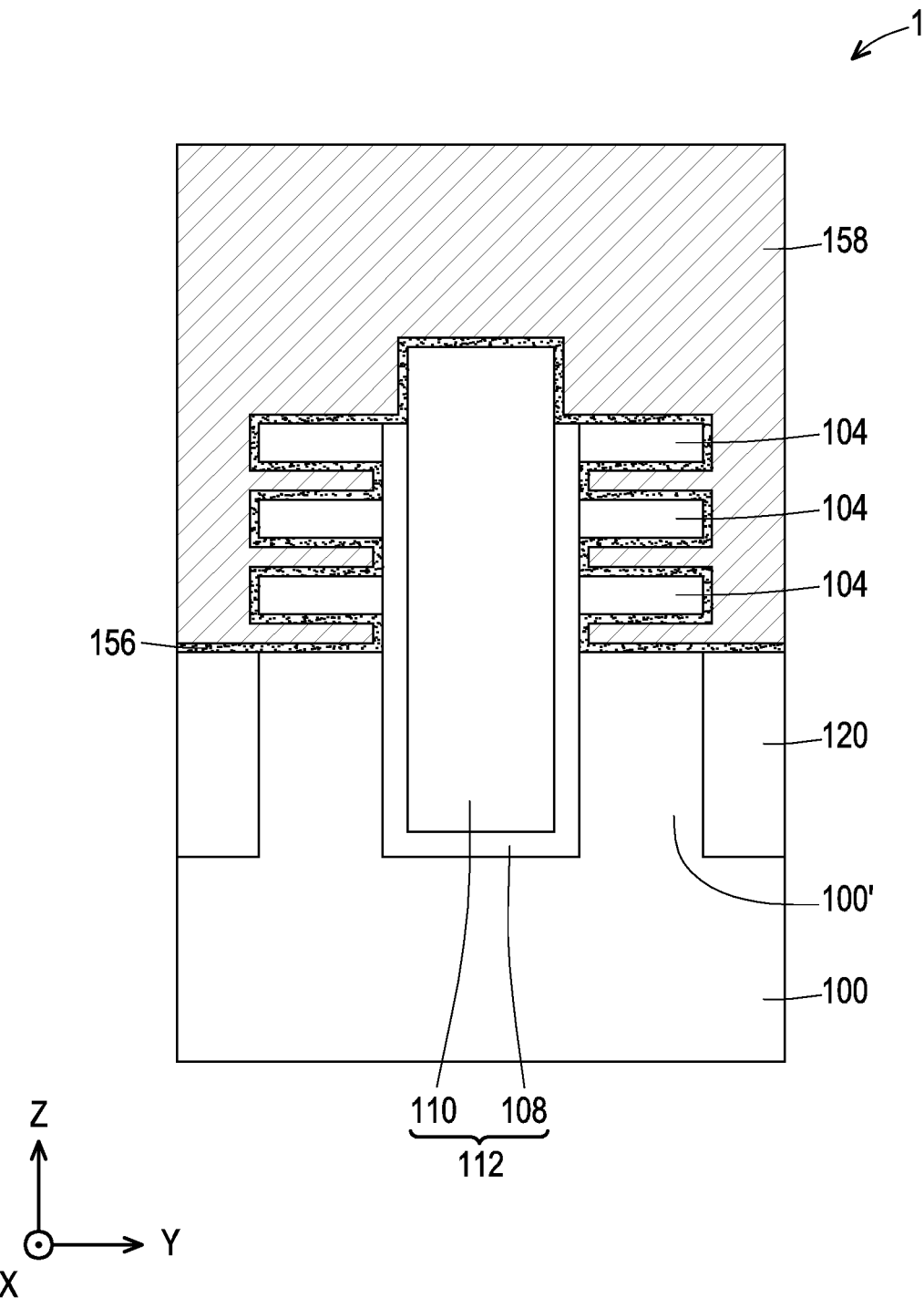
Figure 14B:
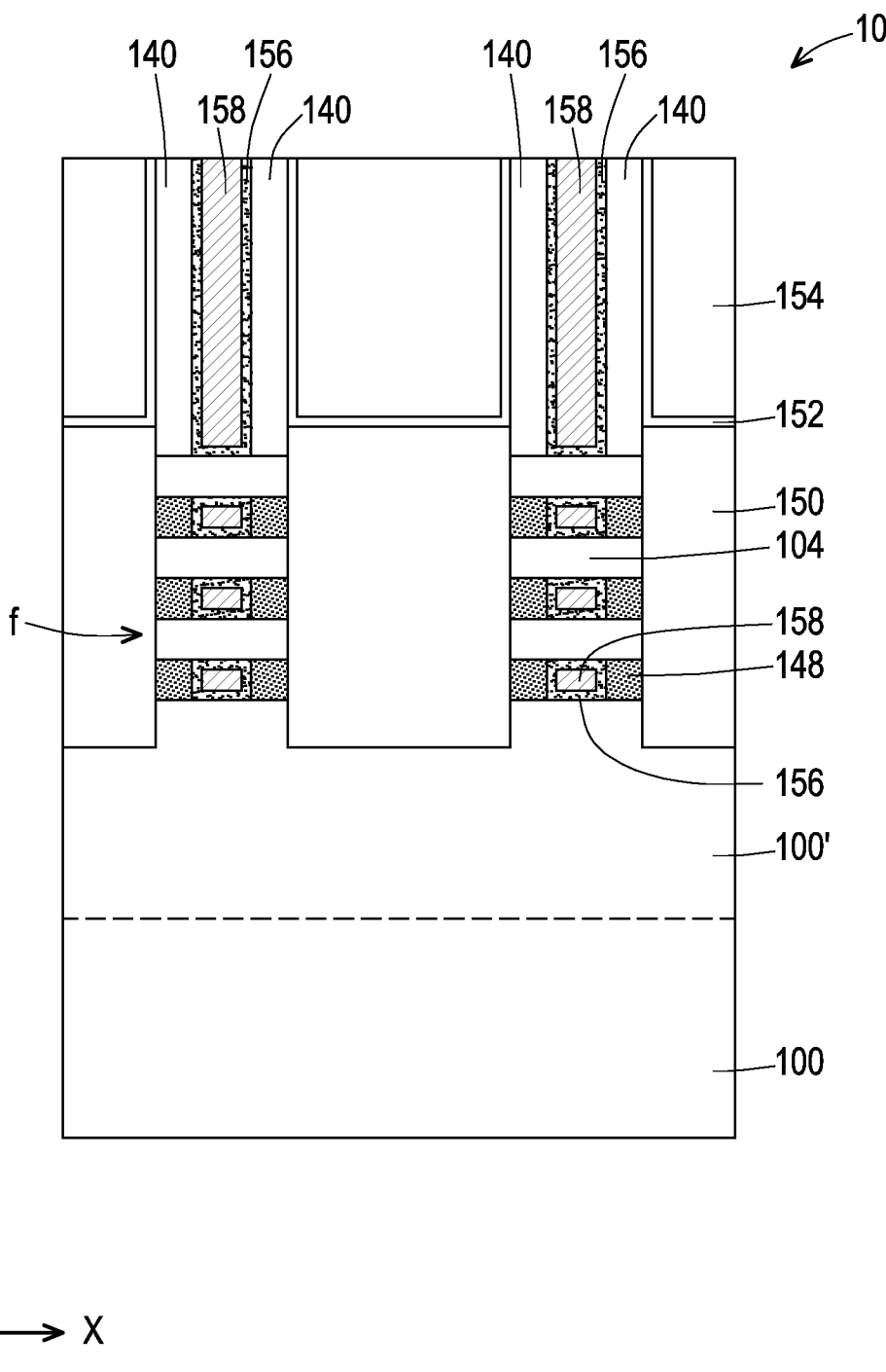
Figure 14C:
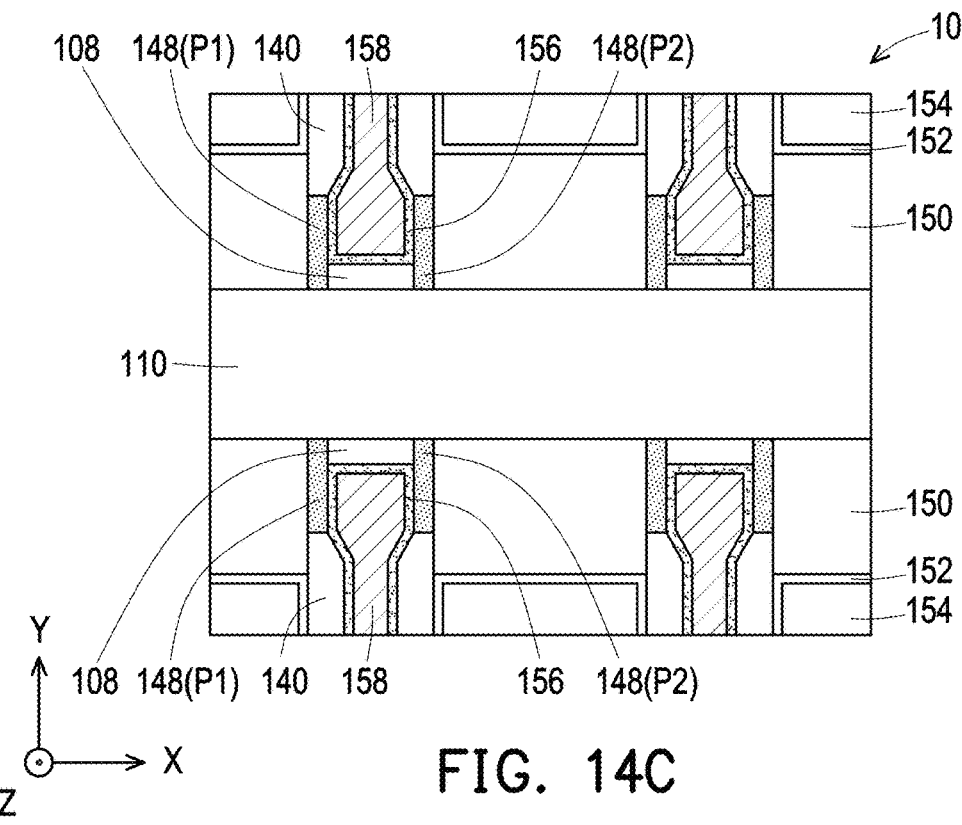
Figure 14D:
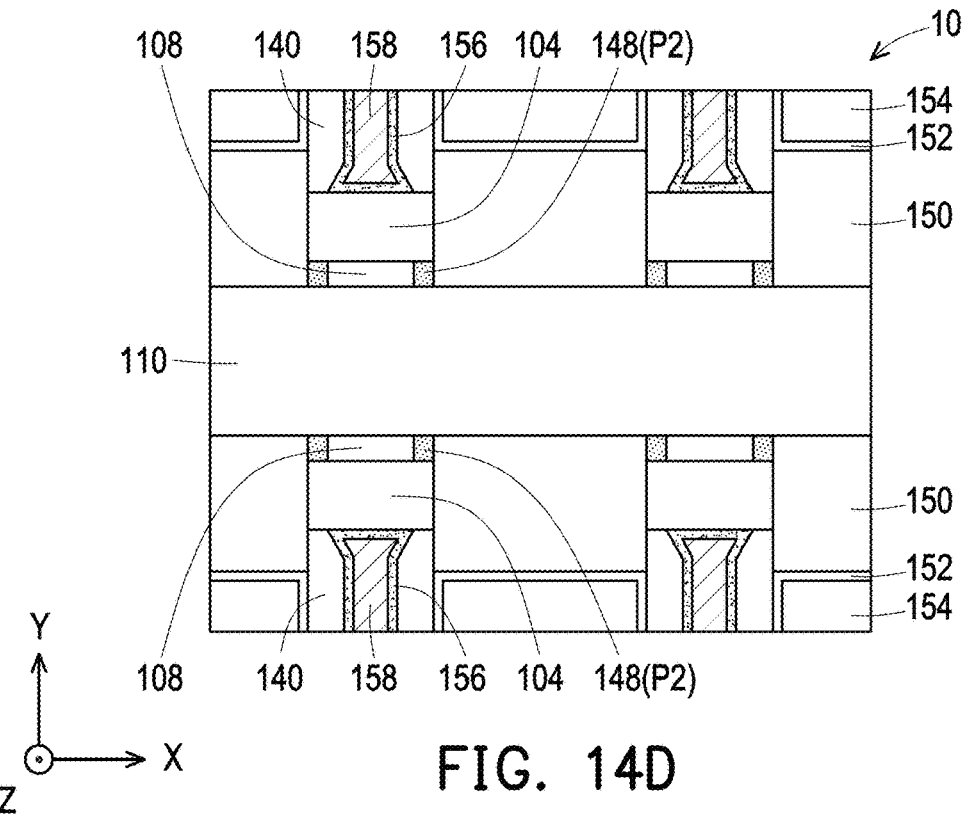

Referring to FIG. 14A, FIG. 14B, FIG. 14C and FIG. 14D, gate dielectric layers 156 and gate electrodes 158 are formed in the gate trenches O1 respectively defined between adjacent gate spacers. Up to here, the semiconductor device 10 is formed. The gate dielectric layers 156 and the gate electrodes 158 may be collectively referred as gate structures, and the previously shown sacrificial gate structures 130 may be regarded as being replaced by the gate structures. As shown in FIG. 14A, FIG. 14B, FIG. 14C and FIG. 14D, the gate dielectric layers 156 are respectively lining on the exposed surfaces of the second semiconductor layers 104, the substrate (i.e., a fin substrate 100'), the inner spacers 148, the gate spacers, the isolation structure 120 and the dielectric wall 112 in the corresponding one of the gate trenches O1 defined between adjacent gate spacers, and the gate electrodes 158 fill the remainder space in these gate trenches O1. From another point of view, as shown in FIG. 14A, three exposed surfaces of each of the second semiconductor layers 104 (i.e., the channel layers) are surrounded by the gate electrode 158. As such, the semiconductor device 10 can be referred to as including a forksheet FET, because there are surfaces of the second semiconductor layers 104 (i.e., the channel layers) attaching to both opposite sides of the dielectric wall 112 (e.g., the liner 108). As mentioned above, in some embodiments, in the forksheet FET, both n-type transistor and p-type transistor are integrated in a same forksheet structure; while in some alternative embodiments, the two same type transistors are integrated in a same forksheet structure.

A material of the gate dielectric layer 156 may include a high-k dielectric material. Examples of the high-k dielectric material may include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. A material of the gate electrode 158 may include TiN, TiCN, TiON, WCN, WN, TSN, TSON, TiAl, TiAlC, TiAlO, TiAlON, other suitable materials, and/or combinations thereof. In addition, a method for forming the gate dielectric layers 156 may include a deposition process, such as a CVD process or an ALD process, whereas a method for forming the gate electrodes 158 may include a deposition process (e.g., a CVD process or an ALD process), a plating process (e.g., an electrical plating process or an electroless plating process) or a combination thereof. In some embodiments, a thickness of the gate dielectric layer 156 ranges from about 5 nm to about 15 nm. In some embodiments, a planarization process is optionally performed to remove the extra parts of the gate dielectric layer 156 and the gate electrode 158.

In some embodiments, one or more work function layer (not shown) is formed between each gate dielectric layer 156 and the overlying gate electrode 158. In addition, in some embodiments, interfacial layers (not shown) may be formed on the exposed surfaces of the second semiconductor layers 104 before forming the gate dielectric layers 156. Those skilled in the art may select proper materials and formation methods for the work function layers and the interfacial layers according to process requirements, the present disclosure is not limited thereto.

It is noted that by removing the liner 108 to form the recesses 146 communicating with the recesses 144 for accommodating the inner spacers 148, each of the inner spacers 148 is located between the corresponding liner 108 and the corresponding S/D electrode 150. As such, during the channel release process and/or the trimming of the second semiconductor layers 104, the inner spacers 148 can well protect the S/D electrodes 150 from being damaged. Since the inner spacers 148 well protect the S/D electrodes 150, leakage paths and extrusion paths for the gate electrodes 158 can be prevented. Accordingly, process window of gate replacement process is enlarged. Therefore, yield and reliability of the semiconductor device 10 are enhanced.

As shown in FIG. 14A, in the semiconductor device 10, three surfaces of each of the second semiconductor layers 104 are directly in contact with the gate structure (including the gate dielectric layer 156 and the gate electrode 158). However, the disclosure is not limited thereto. In some alternative embodiments, four surfaces of each of the second semiconductor layers 104 are directly in contact with the gate structure. Hereinafter, other embodiments will be described with reference to FIG. 15.

Figure 15:
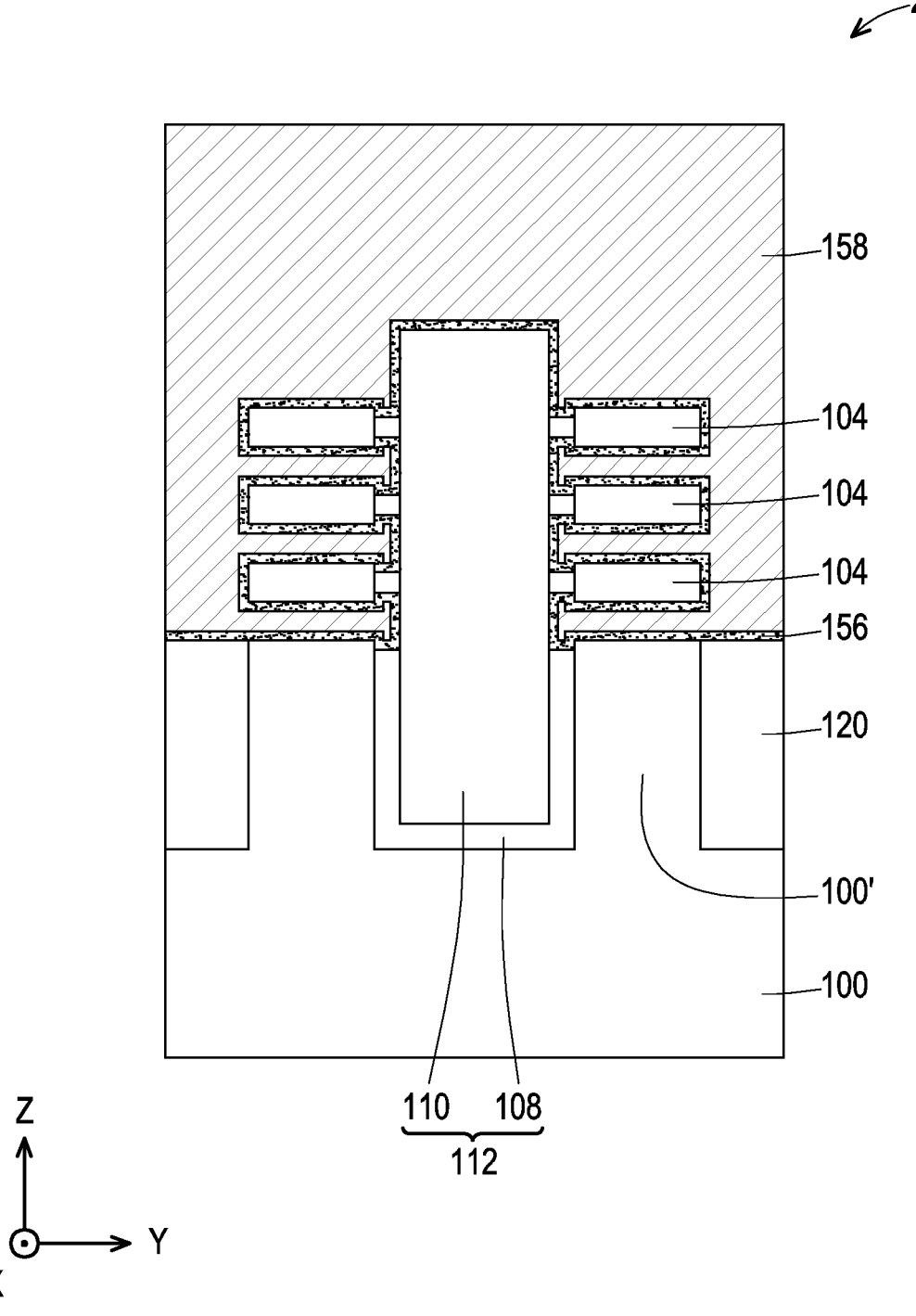
FIG. 15 illustrates a schematic cross-sectional view of a semiconductor device in accordance with some alternative embodiments of the disclosure.

FIG. 15 illustrates a schematic cross-sectional view of a semiconductor device in accordance with some alternative embodiments of the disclosure. The semiconductor device 20 illustrated in FIG. 15 is similar to the semiconductor device 10 illustrated in FIG. 14A, hence the same reference numerals are used to refer to the same or liked parts, and its detailed description will be omitted herein. The differences between the semiconductor device 20 and the semiconductor device 10 lies in that in the semiconductor device 20, portions of the liner 108 are removed to allow the gate structure subsequently formed to be directly in contact with four surfaces of each of the second semiconductor layers 104. In detail, the surface of the second semiconductor layer 104 in contact with the liner 108 is partially covered by the gate structure. As such, in the semiconductor device 20, a larger effective channel width can be realized, and short channel effect (SCE) and drain induced barrier lowering (DIBL) effect can be alleviated. The removal process of the liner 108 for accommodating the gate structure may be performed concurrently with the channel release process, or may be performed after the channel release process is performed.

In accordance with an embodiment, a semiconductor device includes first semiconductor channel layers stacked vertically apart along a first direction over a substrate; second semiconductor channel layers stacked vertically apart along the first direction over the substrate; a dielectric wall disposed between and separating the first semiconductor channel layers and the second first semiconductor channel layers, wherein the dielectric wall comprises a liner and a dielectric wall material disposed over the liner; a gate structure extending along a second direction perpendicular to the first direction disposed, wherein a portion of the gate structure wraps around the first semiconductor channel layers and the second semiconductor channel layers; a source/drain electrode in contact with the first semiconductor channel layers; and an inner spacer enclosed by the first semiconductor channel layers, the gate structure, the dielectric wall and the source/drain electrode, wherein the inner spacer is in contact with the dielectric wall material of the dielectric wall.

In accordance with an embodiment, a semiconductor device includes a dielectric wall extending along a first direction disposed over a substrate, wherein the dielectric wall comprises a dielectric wall material and a liner lining on a first side surface, a second side surface and a bottom surface of the dielectric wall material, and the first side surface is opposite to the second side surface; first semiconductor channel layers vertically stacked along a vertical direction, extending laterally from a portion of the liner on the first side surface of the dielectric wall material along a second direction, the second direction perpendicular to the first direction, the vertical direction perpendicular to the first direction and the second direction; a gate structure over and around the first semiconductor channel layers and extending along the second direction; a source/drain electrode in contact with the first semiconductor channel layers; and an inner spacer having a first portion and a second portion connected with the first portion, the first portion is in contact with the first side surface of the dielectric wall material, and the second portion having patterns disposed in recesses formed between the source/drain electrode and the gate structure and between the first semiconductor channel layers.

In accordance with an embodiment, a method for manufacturing a semiconductor device includes forming a first fin structure and a second fin structure extending along a first direction from a substrate, wherein the first fin structure includes first semiconductor layers and second semiconductor layers alternately stacked along a vertical direction perpendicular to the first direction, and the second fin structure includes third semiconductor layers and fourth semiconductor layers alternately stacked along the vertical direction; forming a dielectric wall between the first fin structure and the second fin structure, wherein the dielectric wall comprises a dielectric wall material and a liner lining on a first side surface, a second side surface and a bottom surface of the dielectric wall material, the first side surface is opposite to the second side surface, the first semiconductor layers and the second semiconductor layers are in contact with the liner lining on the first side surface, and the third semiconductor layers and the fourth semiconductor layers are in contact with the liner lining on the second side surface; forming a sacrificial gate structure extending along a second direction perpendicular to the first direction and the vertical direction over the substrate to cover the first fin structure and the second fin structure; forming gate spacers on the sacrificial gate structure; removing portions of the first fin structure and the second fin structure not overlapped with the sacrificial gate structure; laterally recessing the first semiconductor layers and the third semiconductor layers to form first recesses between the second semiconductor layers and between the fourth semiconductor layers; laterally removing the liner lining on the first side surface and the second side surface to form second recesses communicating with the first recesses; filling an insulating material into the first recesses and the second recesses to form inner spacers in contact with the first side surface and the second side surface; forming source/drain electrodes at the opposite sides of the sacrificial gate structure; removing the sacrificial gate structure, the first semiconductor layers and the third semiconductor layers; and forming a gate structure to surround at least three surfaces of each of the second semiconductor layers and at least three surfaces of each of the fourth semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
first semiconductor channel layers stacked vertically apart along a first direction over a substrate;
second semiconductor channel layers stacked vertically apart along the first direction over the substrate;
a dielectric wall disposed between and separating the first semiconductor channel layers and the second semiconductor channel layers, wherein the dielectric wall comprises a liner and a dielectric wall material disposed over the liner;
a gate structure extending along a second direction perpendicular to the first direction disposed, wherein a portion of the gate structure wraps around the first semiconductor channel layers and the second semiconductor channel layers;
a source/drain electrode in contact with the first semiconductor channel layers; and
an inner spacer enclosed by the first semiconductor channel layers, the gate structure, the dielectric wall and the source/drain electrode, wherein the inner spacer is in contact with the dielectric wall material of the dielectric wall, the inner spacer comprises a first portion and a second portion connected with the first portion, the first portion comprises patterns vertically arranged along a sidewall of the dielectric wall in a vertical direction, the second portion comprises patterns each horizontally arranged between the first semiconductor channel layers, the vertical direction is perpendicular to the first direction and the second direction, and the patterns of the first portion are separated from each other in the vertical direction via the liner.

2. The semiconductor device of claim 1, wherein the inner spacer is located between the source/drain electrode and the liner.

3. The semiconductor device of claim 1, wherein the source/drain electrode is spaced apart from the liner by the inner spacer.

4. The semiconductor device of claim 1, wherein a material of the liner includes an oxide, and a material of the dielectric wall material includes $SiO_2$, SiCN, SiN, $Si_3N_4$, $Al_2O_3$, $HfSiO_4$, $Y_2O_3$, $HfO_2$, $ZrO_2$, $Ta_2O_5$, $La_2O_3$, $LaALO_3$, $Nb_2O_5$, $TiO_2$, $BaTiO_3$, $SrTiO_3$ or a combination thereof.

5. A semiconductor device, comprising:
a dielectric wall extending along a first direction disposed over a substrate, wherein the dielectric wall comprises a dielectric wall material and a liner lining on a first side surface, a second side surface and a bottom surface of the dielectric wall material, and the first side surface is opposite to the second side surface;
first semiconductor channel layers vertically stacked along a vertical direction, extending laterally from a portion of the liner on the first side surface of the dielectric wall material along a second direction, the second direction perpendicular to the first direction, the vertical direction perpendicular to the first direction and the second direction;
a gate structure over and around the first semiconductor channel layers and extending along the second direction;
a source/drain electrode in contact with the first semiconductor channel layers; and
an inner spacer having a first portion and a second portion connected with the first portion, the first portion is in contact with the first side surface of the dielectric wall material, the second portion having patterns disposed in recesses formed between the source/drain electrode and the gate structure and between the first semiconductor channel layers, the first portion has patterns each connected with the corresponding pattern of the second portion, and the patterns of the first portion are separated from each other in the vertical direction via the liner.

6. The semiconductor device of claim 5, wherein the gate structure surrounds three surfaces of each of the first semiconductor channel layers.

7. The semiconductor device of claim 5, wherein the gate structure is in contact with four surfaces of each of the first semiconductor channel layers.

8. The semiconductor device of claim 7, wherein one of the four surfaces is in contact with the portion of the liner on the first side surface of the dielectric wall material and the gate structure.

9. The semiconductor device of claim 5, further comprising:
second semiconductor channel layers vertically stacked along the vertical direction, extending laterally from another portion of the liner on the second side surface of the dielectric wall material along the second direction.

10. The semiconductor device of claim 5, wherein the source/drain electrode is spaced apart from the portion of the liner on the first side surface of the dielectric wall material by the inner spacer.

11. A method for manufacturing a semiconductor device, comprising:

forming a first fin structure and a second fin structure extending along a first direction from a substrate, wherein the first fin structure includes first semiconductor layers and second semiconductor layers alternately stacked along a vertical direction perpendicular to the first direction, and the second fin structure includes third semiconductor layers and fourth semiconductor layers alternately stacked along the vertical direction;

forming a dielectric wall between the first fin structure and the second fin structure, wherein the dielectric wall comprises a dielectric wall material and a liner lining on a first side surface, a second side surface and a bottom surface of the dielectric wall material, the first side surface is opposite to the second side surface, the first semiconductor layers and the second semiconductor layers are in contact with the liner lining on the first side surface, and the third semiconductor layers and the fourth semiconductor layers are in contact with the liner lining on the second side surface;

forming a sacrificial gate structure extending along a second direction perpendicular to the first direction and the vertical direction over the substrate to cover the first fin structure and the second fin structure;

forming gate spacers on the sacrificial gate structure;

removing portions of the first fin structure and the second fin structure not overlapped with the sacrificial gate structure;

laterally recessing the first semiconductor layers and the third semiconductor layers to form first recesses between the second semiconductor layers and between the fourth semiconductor layers;

laterally removing the liner lining on the first side surface and the second side surface to form second recesses communicating with the first recesses;

filling an insulating material into the first recesses and the second recesses to form inner spacers in contact with the first side surface and the second side surface, wherein each of the inner spacers comprises a first portion and a second portion connected with the first portion, the first portion comprises patterns vertically arranged along a sidewall of the dielectric wall in the vertical direction, the second portion comprises patterns each horizontally arranged between the second semiconductor layers or between the fourth semiconductor layers, and the patterns of the first portion are separated from each other in the vertical direction via the liner;

forming source/drain electrodes at the opposite sides of the sacrificial gate structure;

removing the sacrificial gate structure, the first semiconductor layers and the third semiconductor layers; and forming a gate structure to surround at least three surfaces of each of the second semiconductor layers and at least three surfaces of each of the fourth semiconductor layers.

12. The method of claim 11, wherein along the first direction, a distance by which the first semiconductor layers and the third semiconductor layers laterally recessed from the gate spacers is the same as a distance by which the liner laterally removed from the gate spacers.

13. The method of claim 11, wherein the step of forming inner spacers comprises performing a first deposition process to globally form a first insulating material layer, performing an anneal process on the first insulating material layer, performing an etching process on the first insulating material layer, and performing a second deposition process to globally form a second insulating material layer.

14. The method of claim 11, wherein along the first direction, portions of the inner spacers within the second recesses are disposed between the liner and the source/drain electrodes.

15. The method of claim 11, wherein the patterns of the first portion of each of the inner spacers are within the corresponding one of the second recesses.

16. The semiconductor device of claim 1, wherein along the vertical direction, a dimension of each of the patterns of the first portion is greater than a dimension of each of the patterns of the second portion.

17. The semiconductor device of claim 1, wherein the gate structure surrounds three surfaces of each of the first semiconductor channel layers.

18. The semiconductor device of claim 1, wherein one of four surfaces of each of the first semiconductor channel layers is partially in contact with the gate structure, and the gate structure surrounds the other three surfaces of the four surfaces.

19. The semiconductor device of claim 5, wherein along the vertical direction, a dimension of each of the patterns of the first portion is greater than a dimension of each of the patterns of the second portion.

20. The method of claim 11, wherein along the vertical direction, a dimension of each of the patterns of the first portion is greater than a dimension of each of the patterns of the second portion.

* * * * *